United States Patent
Lear et al.

(10) Patent No.: US 11,219,144 B2
(45) Date of Patent: Jan. 4, 2022

(54) ELECTROMAGNETIC SHIELDS FOR SUB-MODULES

(71) Applicant: Qorvo US, Inc., Greensboro, NC (US)

(72) Inventors: Kelly M. Lear, Longwood, FL (US); Thomas Scott Morris, Lewisville, NC (US); Jeffrey Miller, Allen, TX (US); Jeffrey Dekosky, Winter Garden, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/390,761

(22) Filed: Apr. 22, 2019

(65) Prior Publication Data

US 2020/0008327 A1    Jan. 2, 2020

Related U.S. Application Data

(60) Provisional application No. 62/691,440, filed on Jun. 28, 2018.

(51) Int. Cl.
*H05K 9/00* (2006.01)
*H01L 23/552* (2006.01)

(52) U.S. Cl.
CPC ......... *H05K 9/0071* (2013.01); *H01L 23/552* (2013.01); *H05K 9/0037* (2013.01)

(58) Field of Classification Search
CPC .............................. H05K 9/0037; H01L 23/552
See application file for complete search history.

(56) References Cited

U.S. PATENT DOCUMENTS

| | | |
|---|---|---|
| 3,566,190 A | 2/1971 | Huebner et al. |
| 3,907,616 A | 9/1975 | Wiemer |
| | (Continued) | |

FOREIGN PATENT DOCUMENTS

| | | |
|---|---|---|
| CN | 1855451 A | 11/2006 |
| EP | 1715520 B1 | 10/2006 |
| | (Continued) | |

OTHER PUBLICATIONS

Notice of Allowance for U.S. Appl. No. 14/447,847, dated Feb. 29, 2016, 7 pages.

(Continued)

*Primary Examiner* — Hung V Ngo
(74) *Attorney, Agent, or Firm* — Withrow & Terranova, P.L.L.C.

(57) ABSTRACT

Electromagnetic shields for sub-modules of electronic modules are disclosed. Electronic modules may include multiple sub-modules arranged on a substrate with an electromagnetic shield arranged to conformally cover the sub-modules as well as portions of the substrate that are uncovered by the sub-modules. Electromagnetic shields are disclosed that are configured to extend between sub-modules to form one or more divider walls. The one or more divider walls may be configured to extend below mounting surfaces of electronic components in the sub-modules to provide improved reduction of electromagnetic interference (EMI) or crosstalk between various sub-modules. Electromagnetic shields are also disclosed that form perimeter sidewalls that extend below mounting surfaces of electronic components of sub-modules to provide improved reduction of EMI from other modules or other external sources.

18 Claims, 9 Drawing Sheets

(56) References Cited

U.S. PATENT DOCUMENTS

| | | | |
|---|---|---|---|
| 3,907,617 A | 9/1975 | Zwernemann | |
| 4,680,676 A | 7/1987 | Petratos et al. | |
| 5,329,695 A | 7/1994 | Traskos et al. | |
| 5,389,738 A | 2/1995 | Piosenka et al. | |
| 5,406,630 A | 4/1995 | Piosenka et al. | |
| 5,436,203 A | 7/1995 | Lin | |
| 5,459,368 A | 10/1995 | Onishi et al. | |
| 5,473,512 A | 12/1995 | Degani et al. | |
| 5,592,391 A | 1/1997 | Muyshondt et al. | |
| 5,623,293 A | 4/1997 | Aoki | |
| 5,639,989 A | 6/1997 | Higgins, III | |
| 5,646,828 A | 7/1997 | Degani et al. | |
| 5,650,659 A | 7/1997 | Mostafazadeh et al. | |
| 5,870,289 A | 2/1999 | Tokuda et al. | |
| 5,977,626 A | 11/1999 | Wang et al. | |
| 6,004,180 A | 12/1999 | Knall et al. | |
| 6,011,698 A | 1/2000 | Buehler | |
| 6,137,693 A | 10/2000 | Schwiebert et al. | |
| 6,150,193 A | 11/2000 | Glenn | |
| 6,163,454 A | 12/2000 | Strickler | |
| 6,297,957 B1 | 10/2001 | Johnson et al. | |
| 6,429,386 B2 | 8/2002 | DiBene, II et al. | |
| 6,448,583 B1 | 9/2002 | Yoneda et al. | |
| 6,448,793 B1 | 9/2002 | Barratt et al. | |
| 6,466,416 B1 | 10/2002 | Honjo et al. | |
| 6,515,870 B1 | 2/2003 | Skinner et al. | |
| 6,534,859 B1 | 3/2003 | Shim et al. | |
| 6,538,196 B1 | 3/2003 | MacDonald et al. | |
| 6,590,152 B1 | 7/2003 | Horio et al. | |
| 6,599,779 B2 | 7/2003 | Shim et al. | |
| 6,613,660 B2 | 9/2003 | Kahlert et al. | |
| 6,633,073 B2 | 10/2003 | Rezvani et al. | |
| 6,657,592 B2 | 12/2003 | Dening et al. | |
| 6,707,168 B1 | 3/2004 | Hoffman et al. | |
| 6,717,485 B2 | 4/2004 | Kolb et al. | |
| 6,791,795 B2 | 9/2004 | Ohtomo et al. | |
| 6,807,731 B2 | 10/2004 | Brandenburg et al. | |
| 6,825,560 B1 | 11/2004 | Walker et al. | |
| 6,838,750 B2 | 1/2005 | Nuytkens et al. | |
| 6,887,787 B2 | 5/2005 | Farnworth | |
| 6,894,229 B1 | 5/2005 | Cheah | |
| 6,900,383 B2 | 5/2005 | Babb et al. | |
| 6,946,324 B1 | 9/2005 | McLellan et al. | |
| 6,947,295 B2 | 9/2005 | Hsieh | |
| 6,998,532 B2 | 2/2006 | Kawamoto et al. | |
| 7,030,469 B2 | 4/2006 | Mahadevan et al. | |
| 7,042,398 B2 | 5/2006 | Tang et al. | |
| 7,087,461 B2 | 8/2006 | Park et al. | |
| 7,087,462 B1 | 8/2006 | Park et al. | |
| 7,109,410 B2 | 9/2006 | Arnold et al. | |
| 7,109,817 B2 | 9/2006 | Kolb et al. | |
| 7,125,744 B2 | 10/2006 | Takehara et al. | |
| 7,148,574 B2 | 12/2006 | Lee et al. | |
| 7,187,060 B2 | 3/2007 | Usui | |
| 7,227,719 B2 | 6/2007 | Sasaki et al. | |
| 7,259,041 B2 | 8/2007 | Stelzl et al. | |
| 7,330,084 B2 | 2/2008 | Lee et al. | |
| 7,342,303 B1 | 3/2008 | Berry et al. | |
| 7,348,663 B1 | 3/2008 | Kirloskar et al. | |
| 7,433,203 B1 | 10/2008 | Yi et al. | |
| 7,443,693 B2 | 10/2008 | Arnold et al. | |
| 7,445,968 B2 | 11/2008 | Harrison et al. | |
| 7,451,539 B2 | 11/2008 | Morris et al. | |
| 7,478,474 B2 | 1/2009 | Koga | |
| 7,488,903 B2 | 2/2009 | Kawagishi et al. | |
| 7,514,772 B2 | 4/2009 | Kobayashi et al. | |
| 7,548,430 B1 | 6/2009 | Huemoeller et al. | |
| 7,598,606 B2 | 10/2009 | Chow et al. | |
| 7,633,170 B2 | 12/2009 | Yang et al. | |
| 7,633,765 B1 | 12/2009 | Scanlan et al. | |
| 7,635,918 B2 | 12/2009 | Yoshida | |
| 7,636,245 B2 | 12/2009 | Clancy et al. | |
| 7,643,311 B2 | 1/2010 | Coffy | |
| 7,651,889 B2 | 1/2010 | Tang et al. | |
| 7,665,201 B2 | 2/2010 | Sjoedin | |
| 7,671,451 B2 | 3/2010 | Lee et al. | |
| 7,700,411 B2 | 4/2010 | Yang et al. | |
| 7,701,728 B2 | 4/2010 | Hatanaka et al. | |
| 7,745,910 B1* | 6/2010 | Olson | H01L 21/561 257/659 |
| 7,772,046 B2 | 8/2010 | Pagaila et al. | |
| 7,829,981 B2 | 11/2010 | Hsu | |
| 7,902,643 B2 | 3/2011 | Tuttle | |
| 7,902,644 B2 | 3/2011 | Huang et al. | |
| 7,928,538 B2 | 4/2011 | Salzman | |
| 7,989,928 B2 | 8/2011 | Liao et al. | |
| 8,013,258 B2 | 9/2011 | Wu | |
| 8,053,872 B1 | 11/2011 | Swan et al. | |
| 8,061,012 B2 | 11/2011 | Carey et al. | |
| 8,062,930 B1 | 11/2011 | Shah et al. | |
| 8,071,431 B2 | 12/2011 | Hoang et al. | |
| 8,084,300 B1 | 12/2011 | San Antonio et al. | |
| 8,093,690 B2 | 1/2012 | Ko et al. | |
| 8,093,691 B1 | 1/2012 | Fuentes et al. | |
| 8,110,441 B2 | 2/2012 | Chandra et al. | |
| 8,186,048 B2 | 5/2012 | Leahy et al. | |
| 8,220,145 B2 | 7/2012 | Hiner et al. | |
| 8,268,677 B1 | 9/2012 | Pagaila | |
| 8,296,938 B2 | 10/2012 | Carey et al. | |
| 8,296,941 B2 | 10/2012 | Hiner et al. | |
| 8,349,659 B2 | 1/2013 | Swan et al. | |
| 8,359,739 B2 | 1/2013 | Carey et al. | |
| 8,373,264 B2 | 2/2013 | Welch et al. | |
| 8,409,658 B2 | 4/2013 | Hiner et al. | |
| 8,410,584 B2 | 4/2013 | An et al. | |
| 8,434,220 B2 | 5/2013 | Rao et al. | |
| 8,507,319 B2 | 8/2013 | Chow et al. | |
| 8,552,539 B1 | 10/2013 | Foster | |
| 8,614,899 B2 | 12/2013 | Madsen et al. | |
| 8,664,774 B1 | 3/2014 | Mosinskis | |
| 8,720,051 B2 | 5/2014 | Leahy et al. | |
| 8,748,230 B2 | 6/2014 | Welch et al. | |
| 8,835,226 B2 | 9/2014 | Morris et al. | |
| 8,861,221 B2 | 10/2014 | Pagaila | |
| 8,959,762 B2 | 2/2015 | Leahy et al. | |
| 8,987,889 B2 | 3/2015 | Welch et al. | |
| 9,048,020 B2 | 6/2015 | Calvillo Cortes et al. | |
| 9,137,934 B2 | 9/2015 | Morris et al. | |
| 9,450,547 B2 | 9/2016 | Szymanowski et al. | |
| 9,589,927 B2 | 3/2017 | Szymanowski et al. | |
| 9,627,230 B2 | 4/2017 | Carey et al. | |
| 9,661,739 B2 | 5/2017 | Leahy et al. | |
| 9,935,075 B2 | 4/2018 | Huang et al. | |
| 9,978,691 B2 | 5/2018 | Kuo et al. | |
| 2002/0036345 A1 | 3/2002 | Iseki et al. | |
| 2002/0118529 A1 | 8/2002 | Babin et al. | |
| 2002/0142516 A1 | 10/2002 | Light | |
| 2003/0011049 A1 | 1/2003 | Nuytkens et al. | |
| 2003/0048581 A1 | 3/2003 | Ohtomo et al. | |
| 2003/0062541 A1 | 4/2003 | Warner | |
| 2003/0090883 A1 | 5/2003 | Asahi et al. | |
| 2003/0151122 A1 | 8/2003 | Davies | |
| 2004/0063246 A1 | 4/2004 | Karnezos | |
| 2004/0103509 A1 | 6/2004 | Bidard et al. | |
| 2004/0104473 A1 | 6/2004 | Farnworth | |
| 2004/0178500 A1* | 9/2004 | Usui | H01L 24/97 257/734 |
| 2004/0209434 A1 | 10/2004 | Seaford et al. | |
| 2004/0214023 A1 | 10/2004 | Park et al. | |
| 2004/0222511 A1 | 11/2004 | Zhang | |
| 2004/0232536 A1 | 11/2004 | Fukuzumi | |
| 2004/0238934 A1 | 12/2004 | Warner et al. | |
| 2005/0046001 A1 | 3/2005 | Warner | |
| 2005/0153061 A1 | 7/2005 | Nuytkens et al. | |
| 2006/0033184 A1 | 2/2006 | Park et al. | |
| 2006/0113642 A1 | 6/2006 | Kajiki et al. | |
| 2006/0119448 A1 | 6/2006 | Lee et al. | |
| 2006/0151203 A1 | 7/2006 | Krueger et al. | |
| 2006/0223577 A1 | 10/2006 | Ouzillou | |
| 2006/0244131 A1 | 11/2006 | Kobayashi et al. | |
| 2006/0266547 A1 | 11/2006 | Koga | |
| 2006/0273467 A1 | 12/2006 | Brandenburg et al. | |
| 2006/0273813 A1 | 12/2006 | Coffy | |
| 2006/0274517 A1 | 12/2006 | Coffy | |

(56) References Cited

U.S. PATENT DOCUMENTS

| | | |
|---|---|---|
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0155053 A1 | 7/2007 | Karnezos |
| 2007/0163802 A1 | 7/2007 | Monthei |
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |
| 2008/0019112 A1 | 1/2008 | Hatanaka et al. |
| 2008/0054421 A1 | 3/2008 | Dimaano et al. |
| 2008/0067645 A1 | 3/2008 | Foong et al. |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1 | 1/2009 | Mori et al. |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0067149 A1 | 3/2009 | Bogursky et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1 | 3/2010 | Lam |
| 2010/0052125 A1 | 3/2010 | Sasaki et al. |
| 2010/0123233 A1 | 5/2010 | Yoon et al. |
| 2010/0199492 A1 | 8/2010 | Hiner et al. |
| 2010/0207258 A1 | 8/2010 | Eun et al. |
| 2010/0224992 A1 | 9/2010 | McConnelee et al. |
| 2010/0279730 A1 | 11/2010 | Ortiz |
| 2011/0003435 A1 | 1/2011 | Tang et al. |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084368 A1 | 4/2011 | Hoang et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0225803 A1 | 9/2011 | Hiner et al. |
| 2011/0235282 A1 | 9/2011 | Leahy et al. |
| 2011/0298109 A1 | 12/2011 | Pagaila et al. |
| 2011/0298110 A1 | 12/2011 | Pagaila et al. |
| 2011/0298670 A1 | 12/2011 | Jung et al. |
| 2011/0316657 A1 | 12/2011 | Park et al. |
| 2012/0002377 A1 | 1/2012 | French et al. |
| 2012/0025356 A1 | 2/2012 | Liao et al. |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0139640 A1 | 6/2012 | Calvillo Cortes et al. |
| 2012/0182706 A1 | 7/2012 | Siomkos et al. |
| 2012/0217048 A1 | 8/2012 | Leahy et al. |
| 2012/0217624 A1 | 8/2012 | Morris et al. |
| 2012/0218729 A1 | 8/2012 | Carey et al. |
| 2012/0270371 A1 | 10/2012 | DeBar et al. |
| 2012/0286415 A1 | 11/2012 | Sakai et al. |
| 2013/0324069 A1 | 12/2013 | Chen et al. |
| 2014/0077349 A1 | 3/2014 | Higgins, III |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2014/0307394 A1 | 10/2014 | Lobianco et al. |
| 2014/0340859 A1 | 11/2014 | Morris et al. |
| 2014/0353807 A1 | 12/2014 | Welch |
| 2014/0355222 A1 | 12/2014 | Dang et al. |
| 2015/0091157 A9 | 4/2015 | Chi et al. |
| 2015/0124421 A1 | 5/2015 | Leahy et al. |
| 2015/0170986 A1 | 6/2015 | Szymanowski et al. |
| 2015/0296631 A1 | 10/2015 | Morris et al. |
| 2016/0087588 A1 | 3/2016 | Szymanowski et al. |
| 2016/0148882 A1 | 5/2016 | Kim et al. |
| 2016/0211222 A1 | 7/2016 | Kuo et al. |
| 2017/0117230 A1 | 4/2017 | Kumbhat et al. |
| 2017/0118877 A1 | 4/2017 | Kumbhat et al. |
| 2017/0127581 A1 | 5/2017 | Figueredo et al. |
| 2017/0133326 A1 | 5/2017 | Dang et al. |
| 2017/0194281 A1 | 7/2017 | DeLaCruz et al. |
| 2018/0033764 A1 | 2/2018 | Huang et al. |
| 2018/0130755 A1 | 5/2018 | Lee et al. |
| 2019/0371738 A1 | 12/2019 | Morris et al. |

FOREIGN PATENT DOCUMENTS

| | | |
|---|---|---|
| EP | 1717857 A2 | 11/2006 |
| EP | 1764834 B1 | 3/2009 |
| JP | H11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| JP | 2011523120 A | 8/2011 |
| JP | 5254446 B2 | 8/2013 |
| KR | 20060113412 A | 11/2006 |
| TW | 201108360 A | 3/2011 |
| TW | 201142965 A | 12/2011 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009099699 A1 | 8/2009 |
| WO | 2009144960 A1 | 12/2009 |
| WO | 2010014103 A1 | 2/2010 |
| WO | 2010021262 A1 | 2/2010 |

OTHER PUBLICATIONS

Notice of Allowance for U.S. Appl. No. 14/447,847, dated Mar. 31, 2016, 7 pages.

Corrected Notice of Allowability for U.S. Appl. No. 14/447,847, dated Jul. 15, 2016, 4 pages.

Final Office Action for U.S. Appl. No. 13/906,892, dated Feb. 11, 2016, 10 pages.

Advisory Action for U.S. Appl. No. 13/906,892, dated Jun. 15, 2016, 2 pages.

Final Office Action for U.S. Appl. No. 13/906,892, dated Aug. 26, 2016, 11 pages.

Advisory Action for U.S. Appl. No. 13/906,892, dated Nov. 28, 2016, 3 pages.

Final Office Action for U.S. Appl. No. 13/906,892, dated Dec. 15, 2016, 11 pages.

Advisory Action for U.S. Appl. No. 13/906,892, dated Mar. 14, 2017, 3 pages.

(56) References Cited

OTHER PUBLICATIONS

Non-Final Office Action for U.S. Appl. No. 13/906,892, dated Apr. 3, 2017, 9 pages.
Notice of Allowance for U.S. Appl. No. 13/906,892, dated May 19, 2017, 9 pages.
Notice of Allowance for U.S. Appl. No. 11/952,690, dated Aug. 30, 2010, 9 pages.
Non-Final Office Action for U.S. Appl. No. 11/952,690, dated Mar. 25, 2010, 9 pages.
Non-Final Rejection for U.S. Appl. No. 12/913,364, dated Feb. 13, 2012, 6 pages.
Notice of Allowance for U.S. Appl. No. 12/913,364, dated Jun. 8, 2012, 8 pages.
Non-Final Office Action for U.S. Appl. No. 13/189,838, dated Mar. 14, 2014, 14 pages.
Final Office Action for U.S. Appl. No. 13/189,838, dated Jun. 19, 2014, 10 pages.
Advisory Action for U.S. Appl. No. 13/189,838, dated Aug. 28, 2014, 2 pages.
Non-Final Office Action for U.S. Appl. No. 13/189,838, dated Oct. 28, 2014, 11 pages.
Final Office Action for U.S. Appl. No. 13/189,838, dated Feb. 20, 2015, 13 pages.
Non-Final Office Action for U.S. Appl. No. 13/034,755, dated Aug. 15, 2013, 6 pages.
Final Office Action for U.S. Appl. No. 13/034,755, dated Jan. 31, 2014, 10 pages.
Advisory Action for U.S. Appl. No. 13/034,755, dated Mar. 4, 2014, 3 pages.
Notice of Allowance for U.S. Appl. No. 13/034,755, dated Oct. 17, 2014, 7 pages.
Non-Final Office Action for U.S. Appl. No. 13/034,787, dated Jan. 16, 2013, 9 pages.
Final Office Action for U.S. Appl. No. 13/034,787, dated Mar. 19, 2013, 9 pages.
Advisory Action for U.S. Appl. No. 13/034,787, dated May 17, 2013, 3 pages.
Non-Final Office Action for U.S. Appl. No. 13/034,787, dated Aug. 9, 2013, 9 pages.
Final Office Action for U.S. Appl. No. 13/034,787, dated Nov. 15, 2013, 12 pages.
Advisory Action for U.S. Appl. No. 13/034,787, dated Jan. 27, 2014, 4 pages.
Advisory Action for U.S. Appl. No. 13/034,787, dated Feb. 26, 2014, 4 pages.
Notice of Allowance for U.S. Appl. No. 13/034,787, dated May 1, 2014, 9 pages.
Corrected Notice of Allowability for U.S. Appl. No. 13/034,787, dated Jul. 29, 2014, 5 pages.
Non-Final Office Action for U.S. Appl. No. 12/797,381, dated Jan. 8, 2013, 20 pages.
Final Office Action for U.S. Appl. No. 12/797,381, dated May 16, 2013, 19 pages.
Advisory Action for U.S. Appl. No. 12/797,381, dated Jul. 17, 2013, 3 pages.
Examiner's Answer for U.S. Appl. No. 12/797,381, dated Dec. 31, 2013, 6 pages.
Final Office Action for U.S. Appl. No. 13/036,272, dated Oct. 20, 2014, 6 pages.
Advisory Action for U.S. Appl. No. 13/036,272, dated Jan. 8, 2015, 3 pages.
Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: A Division of Parker Hannifin Corporation, Dec. 8, 2000, 3 pages, Retrieved from: http://www.chomerics.com/products/choshield_coatings.htm.
Author Unknown, "Fractional-N RF Synthesizer with Modulator and Digital IF Filter (RF6001)," RF Micro Devices: Part of the Polaris Total Radio Solution, 2005, 2 pages.
Notice of Allowance for U.S. Appl. No. 13/189,838, dated May 4, 2015, 8 pages.
Notice of Allowance for U.S. Appl. No. 13/189,838, dated Jul. 30, 2015, 5 pages.
Non-Final Office Action for U.S. Appl. No. 13/036,272, dated Apr. 14, 2015, 7 pages.
Non-Final Office Action for U.S. Appl. No. 14/447,847, dated May 7, 2015, 7 pages.
Final Office Action for U.S. Appl. No. 14/447,847, dated Sep. 14, 2015, 8 pages.
Non-Final Office Action for U.S. Appl. No. 13/906,892, dated Aug. 10, 2015, 10 pages.
International Preliminary Report on Patentability and Written Opinion for International Patent Application No. PCT/US2008/068153, dated Jan. 5, 2010, 6 pages.
Non-Final Office Action for U.S. Appl. No. 14/595,401, dated Mar. 28, 2016, 14 pages.
Examination Report for Indian Patent Application No. 8469/DELNP/2009, dated Apr. 11, 2017, 7 pages.
Final Office Action for U.S. Appl. No. 14/595,401, dated Oct. 6, 2016, 15 pages.
Notice of Allowance for U.S. Appl. No. 14/595,401, dated Jan. 6, 2017, 8 pages.
Non-Final Office Action for U.S. Appl. No. 14/750,384, dated Aug. 10, 2017, 9 pages.
Notice of Allowance for U.S. Appl. No. 14/750,384, dated Nov. 22, 2017, 8 pages.
Decision on Appeal for U.S. Appl. No. 12/797,381, dated Mar. 11, 2016, 6 pages.
Final Office Action for U.S. Appl. No. 13/036,272, dated Nov. 19, 2015, 9 pages.
Advisory Action for U.S. Appl. No. 13/036,272, dated Feb. 5, 2016, 3 pages.
Non-Final Office Action for U.S. Appl. No. 13/036,272, dated Apr. 8, 2016, 7 pages.
Notice of Allowance for U.S. Appl. No. 13/036,272, dated Sep. 30, 2016, 5 pages.
Final Office Action for U.S. Appl. No. 14/447,847, dated Dec. 11, 2015, 8 pages.
Notice of Allowance for U.S. Appl. No. 11/199,319, dated Oct. 2, 2008, 6 pages.
Non-Final Office Action for U.S. Appl. No. 11/435,913, dated May 21, 2010, 5 pages.
Final Office Action for U.S. Appl. No. 11/435,913, dated Nov. 17, 2009, 8 pages.
Non-Final Office Action for U.S. Appl. No. 11/435,913, dated Mar. 2, 2009, 8 pages.
Final Office Action for U.S. Appl. No. 11/435,913, dated Aug. 15, 2008, 8 pages.
Non-Final Office Action for U.S. Appl. No. 11/435,913, dated Jan. 7, 2008, 7 pages.
Non-Final Office Action for U.S. Appl. No. 11/768,014, dated Jan. 21, 2009, 9 pages.
Non-Final Office for U.S. Appl. No. 11/768,014, dated Mar. 25, 2010, 9 pages.
Non-Final Office for U.S. Appl. No. 11/768,014, dated Jul. 10, 2009, 7 pages.
Notice of Allowance for U.S. Appl. No. 13/187,814, dated Sep. 10, 2012, 8 pages.
Non-Final Office Action for U.S. Appl. No. 11/952,484, dated Jan. 8, 2010, 17 pages.
Final Office Action for U.S. Appl. No. 11/952,484, dated Oct. 5, 2010, 19 pages.
Non-Final Office Action for U.S. Appl. No. 11/952,484, dated Oct. 27, 2011, 22 pages.
Non-Final Office Action for U.S. Appl. No. 13/415,643, dated Jan. 3, 2013, 17 pages.
Quayle Action for U.S. Appl. No. 13/415,643, dated Jul. 11, 2013, 6 pages.

(56) References Cited

OTHER PUBLICATIONS

Notice of Allowance for U.S. Appl. No. 13/415,643, dated Aug. 15, 2013, 8 pages.
Non-Final Office Action for U.S. Appl. No. 11/952,513, dated May 10, 2011, 19 pages.
Final Office Action for U.S. Appl. No. 11/952,513, dated Oct. 26, 2011, 16 pages.
Notice of Allowance for U.S. Appl. No. 11/952,513, dated Mar. 6, 2012, 9 pages.
Non-Final Office Action for U.S. Appl. No. 13/117,284, dated Nov. 9, 2011, 12 pages.
Final Office Action for U.S. Appl. No. 13/117,284, dated Feb. 29, 2012, 8 pages.
Notice of Allowance for U.S. Appl. No. 13/117,284, dated May 1, 2012, 8 pages.
Non-Final Office Action for U.S. Appl. No. 11/952,545, dated Oct. 23, 2009, 12 pages.
Non-Final Office Action for U.S. Appl. No. 12/766,347, dated Jun. 29, 2012, 11 pages.
Notice of Allowance for U.S. Appl. No. 11/952,592, dated Aug. 6, 2012, 7 pages.
Non-Final Office Action for U.S. Appl. No. 11/952,592, dated Sep. 19, 2011, 9 pages.
Final Office Action for U.S. Appl. No. 11/952,592, dated Feb. 24, 2011, 9 pages.
Non-Final Office Action for U.S. Appl. No. 11/952,592, dated Dec. 15, 2010, 9 pages.
Non-Final Office Action for U.S. Appl. No. 11/952,592, dated Jul. 28, 2009, 7 pages.
Final Office Action for U.S. Appl. No. 11/952,592, dated Apr. 16, 2010, 8 pages.
Final Office Action for U.S. Appl. No. 11/952,592, dated Jan. 18, 2012, 10 pages.
Non-Final Office Action for U.S. Appl. No. 11/952,592, dated Jun. 12, 2012, 10 pages.
Notice of Allowance for U.S. Appl. No. 11/952,617, dated Jan. 8, 2013, 8 pages.
Notice of Allowance for U.S. Appl. No. 11/952,617, dated Jun. 4, 2012, 9 pages.
Final Office Action for U.S. Appl. No. 11/952,617, dated Feb. 16, 2012, 7 pages.
Non-Final Office Action for U.S. Appl. No. 11/952,617, dated Jul. 28, 2011, 9 pages.
Non-Final Office Action for U.S. Appl. No. 11/952,617, dated Sep. 26, 2008, 10 pages.
Final Office Action for U.S. Appl. No. 11/952,617, dated Nov. 20, 2009, 16 pages.
Non-Final Office Action for U.S. Appl. No. 11/952,634, dated Jun. 13, 2011, 7 pages.
Final Office Action for U.S. Appl. No. 11/952,634, dated Feb. 1, 2011, 7 pages.
Final Office Action for U.S. Appl. No. 11/952,634, dated Dec. 23, 2010, 8 pages.
Non-Final Office Action for U.S. Appl. No. 11/952,634, dated Jul. 21, 2010, 7 pages.
Notice of Allowance for U.S. Appl. No. 13/151,499, dated Dec. 19, 2013, 8 pages.
International Search Report for PCT/US2008/068153, dated Dec. 9, 2008, 3 pages.
Office Action for Chinese Patent Application No. 200880104171.1, dated Jun. 2, 2011, 20 pages.
Second Office Action for Chinese Patent Application No. 200880104171.1, dated Feb. 16, 2012, 8 pages.
Non-Final Office Action for U.S. Appl. No. 11/952,670, dated Jun. 22, 2011, 4 pages.
Non-Final Office Action for U.S. Appl. No. 11/952,670, dated May 27, 2010, 6 pages.
Notice of Allowance for U.S. Appl. No. 11/952,670, dated Oct. 21, 2009, 6 pages.
Notice of Allowance for U.S. Appl. No. 11/952,670, dated Aug. 24, 2012, 7 pages.
Hearing Notice for Indian Patent Application No. 8469/DELNP/2009, dated Dec. 26, 2019, 3 pages.
International Search Report and Written Opinion for International Patent Application No. PCT/US2019/066721, dated Apr. 24, 2020, 16 pages.
Non-Final Office Action for U.S. Appl. No. 16/372,910, dated Mar. 30, 2020, 13 pages.
Final Office Action for U.S. Appl. No. 16/372,910, dated Aug. 13, 2020, 13 pages.
Advisory Action for U.S. Appl. No. 16/372,910, dated Oct. 27, 2020, 3 pages.
Non-Final Office Action for U.S. Appl. No. 16/893,941, dated Sep. 23, 2020, 8 pages.
Non-Final Office Action for U.S. Appl. No. 16/417,815, dated Sep. 16, 2020, 14 pages.
Non-Final Office Action for U.S. Appl. No. 16/372,910, dated Dec. 31, 2020, 13 pages.
Notice of Allowance for U.S. Appl. No. 16/893,941, dated Feb. 26, 2021, 7 pages.
Non-Final Office Action for U.S. Appl. No. 16/579,080, dated Dec. 10, 2020, 9 pages.
Notice of Allowance for U.S. Appl. No. 16/372,910, dated May 18, 2021, 8 pages.
Notice of Allowance for U.S. Appl. No. 16/579,080, dated Apr. 22, 2021, 7 pages.
Non-Final Office Action for U.S. Appl. No. 16/417,815, dated Mar. 22, 2021, 15 pages.
Notice of Allowance for U.S. Appl. No. 16/390,761, dated Aug. 27, 2021, 7 pages.
International Preliminary Report on Patentability for International Patent Application No. PCT/US2019/066721, dated Jul. 1, 2021, 10 pages.

\* cited by examiner

ELECTROMAGNETIC SHIELDS FOR SUB-MODULES

RELATED APPLICATIONS

This application claims the benefit of provisional patent application Ser. No. 62/691,440, filed Jun. 28, 2018, the disclosure of which is hereby incorporated herein by reference in its entirety.

FIELD OF THE DISCLOSURE

The present disclosure relates to electromagnetic shields for electronic devices, and particularly to electromagnetic shields for sub-modules of electronic devices.

BACKGROUND

Electronic components have become ubiquitous in modern society. The electronics industry routinely announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed transitions inherently mean higher frequencies. Higher frequencies mean shorter wavelengths, requiring shorter conductive elements to act as antennas to broadcast these electromagnetic emissions. The electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have many radiating elements that raise EMI concerns. Thus, even electronic modules that do not have high clock speeds may need to address EMI issues.

One way to reduce EMI to comply with FCC regulations is to electromagnetically shield the electronic modules. Typically a shield is formed from a grounded conductive material that surrounds an electronic module. When electromagnetic emissions from the electronic module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the electronic module experiences reduced EMI from other electronic modules.

However, as electronic modules continue to become smaller from miniaturization, creating effective shields that do not materially add to the size of modules becomes more difficult. Thus, there is a need for an electromagnetic shield that is inexpensive to manufacture on a large scale, does not substantially increase the size of electronic modules, and effectively deals with EMI concerns.

SUMMARY

The present disclosure relates to electromagnetic shields for electronic devices, and particularly to electromagnetic shields for sub-modules of electronic modules. Electronic modules as disclosed herein may include multiple sub-modules arranged on a substrate with an electromagnetic shield arranged to conformally cover the sub-modules as well as portions of the substrate that are uncovered by the sub-modules. Electromagnetic shields are disclosed that are configured to extend between sub-modules to form one or more divider walls. In certain embodiments, the one or more divider walls are configured to extend into the substrate to provide improved reduction of electromagnetic interference (EMI) or crosstalk between the sub-modules. In certain embodiments, various electromagnetic shields may further form perimeter sidewalls that also extend into their corresponding substrates to provide improved reduction of EMI from other modules or other external sources.

In one aspect, an electronic module comprises: a substrate; a first sub-module and a second sub-module arranged on a mounting surface of the substrate; and an electromagnetic shield arranged on the first sub-module and the second sub-module, wherein a portion of the electromagnetic shield is configured to extend between the first sub-module and the second sub-module to form a divider wall that extends below the mounting surface. The substrate may comprise a plurality of metal layers and one or more dielectric layers. In certain embodiments, the portion of the electromagnetic shield that is between the first sub-module and the second sub-module is configured to extend through at least a portion of a first dielectric layer of the one or more dielectric layers. The first sub-module comprises one or more first electronic components within a first overmold body and the second sub-module comprises one or more second electronic components within a second overmold body. In certain embodiments, the electromagnetic shield is configured to be conformal with the first overmold body and the second overmold body. At least one of the one or more first electronic components may comprise a wirebond connection that at least partially extends into the first overmold body. In certain embodiments, the electromagnetic shield is conformal over the first sub-module, the second sub-module, and a portion of the mounting surface that is uncovered by the first sub-module and the second sub-module. In certain embodiments, the electromagnetic shield forms a perimeter sidewall that is configured to extend into a perimeter portion of the substrate. In certain embodiments, the perimeter sidewall may extend to a different horizontal plane within the substrate than the divider wall. In other embodiments, the perimeter sidewall extends to a same horizontal plane within the substrate as the divider wall. In certain embodiments, the electromagnetic shield forms a plurality of divider walls between the first sub-module and the second sub-module.

In another aspect, an electronic module comprises: a substrate; a first sub-module and a second sub-module arranged on a mounting surface of the substrate with an opening formed therebetween; an electromagnetic shield arranged on the first sub-module and the second sub-module, wherein a portion of the electromagnetic shield is configured to extend into the opening and along a portion of the substrate that is between the first sub-module and the second sub-module; and a fill material that is arranged on the portion of the electromagnetic shield that is in the opening. In certain embodiments, the fill material is configured to partially fill the opening. In certain embodiments, the fill material is configured to completely fill the opening. The fill material may comprise a conductive material. In certain embodiments, the first sub-module comprises one or more first electronic components within a first overmold body and the second sub-module comprises one or more second electronic components within a second overmold body. The fill material may comprise a same material as the first overmold body and the second overmold body. In certain embodiments, a plurality of openings are formed between the first sub-module and the second sub-module. In certain embodiments, the fill material at least partially fills the plurality of openings. In certain embodiments, the fill material is configured to extend below the mounting surface of the substrate.

In another aspect, a method comprises: mounting a plurality of electronic components to a mounting face of a substrate structure; depositing an overmold material to cover the plurality of electronic components; removing portions of the overmold material along a plurality of first separation lines that define a plurality of modules; removing portions of the overmold material along a plurality of second separation lines that at least partially define a plurality of sub-modules within each module of the plurality of modules, the removing along the plurality of second separation lines forming openings that are configured to extend below the mounting face; and depositing an electromagnetic shield to conformally coat the plurality of sub-modules and the openings. In certain embodiments, the method further comprises dicing the substrate structure to singulate the plurality of modules. In certain embodiments, each sub-module of the plurality of sub-modules comprises an overmold body and at least one electronic component of the plurality of electronic components. In certain embodiments, removing portions of the overmold material along the plurality of first separation lines and the plurality of second separation lines comprises at least one of cutting, drilling, or etching. In certain embodiments, a plurality of overmold bodies are formed by removing portions of the overmold material along the plurality of first separation lines and the plurality of second separation lines. In certain embodiments, depositing the electromagnetic shield comprises conformally coating the plurality of overmold bodies. The electromagnetic shield may form one or more divider walls between a first sub-module and a second sub-module of the plurality of sub-modules. In certain embodiments, the one or more divider walls may be configured to extend below the mounting surface of the substrate structure. In certain embodiments, depositing the electromagnetic shield comprises sequentially depositing a first seed layer, a second layer, and a third layer. In certain embodiments, the first seed layer is deposited by electroless plating, the second layer is deposited by electrolytic plating, and the third layer is deposited by electrolytic plating.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
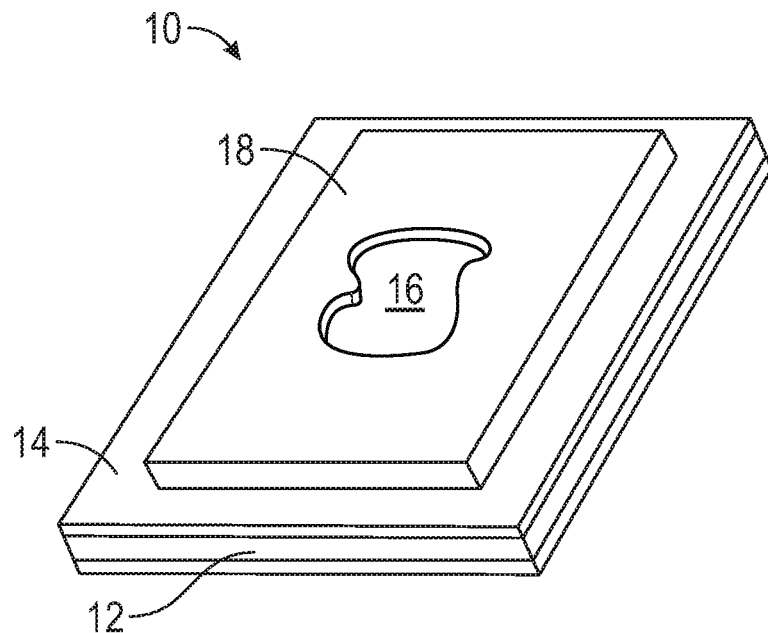
FIG. 1A illustrates a representative module having one sub-module, which is covered by an overmold body according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to electromagnetic shields for electronic devices, and particularly to electromagnetic shields for sub-modules of electronic modules. Electronic modules as disclosed herein may include multiple sub-modules arranged on a substrate with an electromagnetic shield arranged to conformally cover the sub-modules as well as portions of the substrate that are uncovered by the sub-modules. Electromagnetic shields are disclosed that are configured to extend between sub-modules to form one or more divider walls. In certain embodiments, the one or more divider walls are configured to extend into the substrate to provide improved reduction of electromagnetic interference (EMI) or crosstalk between the sub-modules. In certain embodiments, various electromagnetic shields may further form perimeter sidewalls that also extend into their corresponding substrates to provide improved reduction of EMI from other modules or other external sources.

The present invention may be used to form one or more electromagnetic shields for corresponding component areas of a given electronic module. In certain embodiments, a meta-module having circuitry for two or more modules is formed on a substrate structure, which may include a laminated substrate structure. As such, the circuitry for different modules is initially formed on the single meta-module. Each module will have one or more component areas in which the circuitry is formed. A metallic structure is formed on or in the substrate for each component area to be shielded on the substrate. The metallic structure may be formed from traces, vias, metallic layers, metallic components, plating materials, or the like, as well as any combination thereof. In one embodiment, each metallic structure extends about all or a portion of the periphery of each of the component areas to be shielded. A single body, such as an overmold body, is then formed over all of the modules on the meta-module. After the body is formed, at least a portion of the metallic structure for each component area to be shielded is exposed through the body by a cutting, drilling, or like operation. Next, an electromagnetic shield material is applied to an exterior surface of the body of each of the component areas to be shielded and in contact with the exposed portion of the metallic structures. The modules are then singulated from each other to form separate modules, each of which having one or more integrally shielded component areas.

In certain embodiments, the electromagnetic shield material is provided using an electroless plating process, which deposits a conductive seed layer on the overmold body and in contact with the exposed portions of the metallic structures. Then, an electrolytic plating process is used to deposit a second conductive layer onto the conductive seed layer. A final layer of a metallic material, such as nickel, is then deposited on top of the second conductive layer through an electrolytic plating process. In another embodiment, the electromagnetic shield is provided by applying a conductive epoxy or paint to the body and in contact with the exposed portion of the metallic structures. In other embodiments, the electromagnetic shield may be provided by metallized thin film-based processes, such as, for example physical vapor deposition, sputtering, evaporation, chemical vapor deposition, and/or atomic layer deposition, among others. In these embodiments, the conductive layers create an integrated electromagnetic shield for one or more component areas of a module to reduce electromagnetic interference (EMI).

For the following description, the preferred embodiments of the present invention are described. The scope of the invention and the claims that follow shall not be limited to these preferred embodiments. For example, the metallic structure in the preferred embodiments is formed in whole or in part from a metallic layer grid that resides on or in the surface of the substrate. Further, the metallic structure resides along all or a portion of the periphery of one or more component areas. These embodiments lend themselves to efficient processing; however, those skilled in the art will recognize that the metallic structure to which the integrated electromagnetic shield is connected need not reside along the periphery of the component area, or be part of a metallic layer grid. Importantly, the metallic structure may take virtually any form or shape, and may reside on or in the top surface of the substrate. The metallic structure may merely be a single point along the top surface of the module, as well as a continuous or segmented structure that extends along all or a portion of the one or more component areas to be shielded. Accordingly, the metallic layer grid used in the following embodiments to provide a metallic structure is merely provided to illustrate the preferred embodiments, and as such, shall not limit what constitutes a metallic structure or how a metallic structure is formed according to the present invention.

Figure 1B:
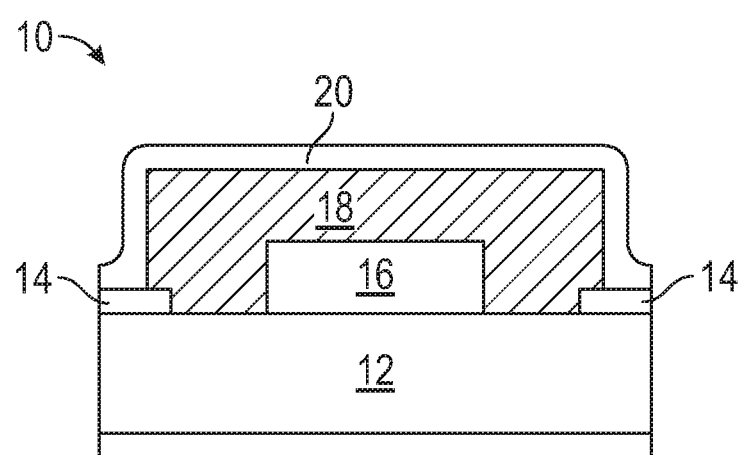
FIG. 1B illustrates a cross-section of the module of FIG. 1A in which an integrated electromagnetic shield is provided according to embodiments disclosed herein.

A module 10 is illustrated in FIG. 1A and FIG. 1B according to certain embodiments of the present invention. The module 10 has a substrate 12, which may include a laminate structure that comprises a metallic structure formed from a metallic layer grid 14 on or in a top surface of the substrate 12. In certain embodiments, the substrate 12 may comprise an epoxy laminate, such as FR-4 and the like. The substrate 12 may also be formed from other materials including ceramics and/or alumina. As indicated above, any metallic structure may be used; however, the preferred embodiment uses a portion of the metallic layer grid 14 to form a peripheral metallic structure. Only one section of the metallic layer grid 14 is depicted in these figures and the peripheral metallic structure is not separately labeled, as it is formed from the metallic layer grid 14. The illustrated module 10 has a single component area 16 that lies within the peripheral metallic structure and in which circuitry for the module 10 is formed. The component area 16 may include one or more electronic components of various types depending on the application. For example, the electronic components may include an electronic circuit built on its own semiconductor substrate, such as a processor, volatile memory, non-volatile memory, a radio frequency circuit, or a micro-mechanical system (MEMS) device. In certain embodiments, electronic components may include one or more electrical devices such as filters, capacitors, inductors, resistors, amplifiers, low-noise amplifiers (LNA), switching devices, transmit/receive modules, or electronic circuits having combinations thereof. A body, such as an overmold body 18 or overmold material, which is formed from a dielectric material, resides over the substrate 12 and encompasses the component area 16. As depicted in FIG. 1B, an electromagnetic shield 20 is integrally formed over the overmold body 18 and in contact with exposed portions of the peripheral metallic structure of the metallic layer grid 14 to provide shielding from electromagnetic emissions. In certain embodiments, the peripheral metallic structure of the metallic layer grid 14 is coupled to ground and accordingly, the electromagnetic shield 20 is electrically grounded. In this manner, electromagnetic emissions that strike the electromagnetic shield 20 are electrically shorted to ground, thereby reducing EMI.

Figure 2A:
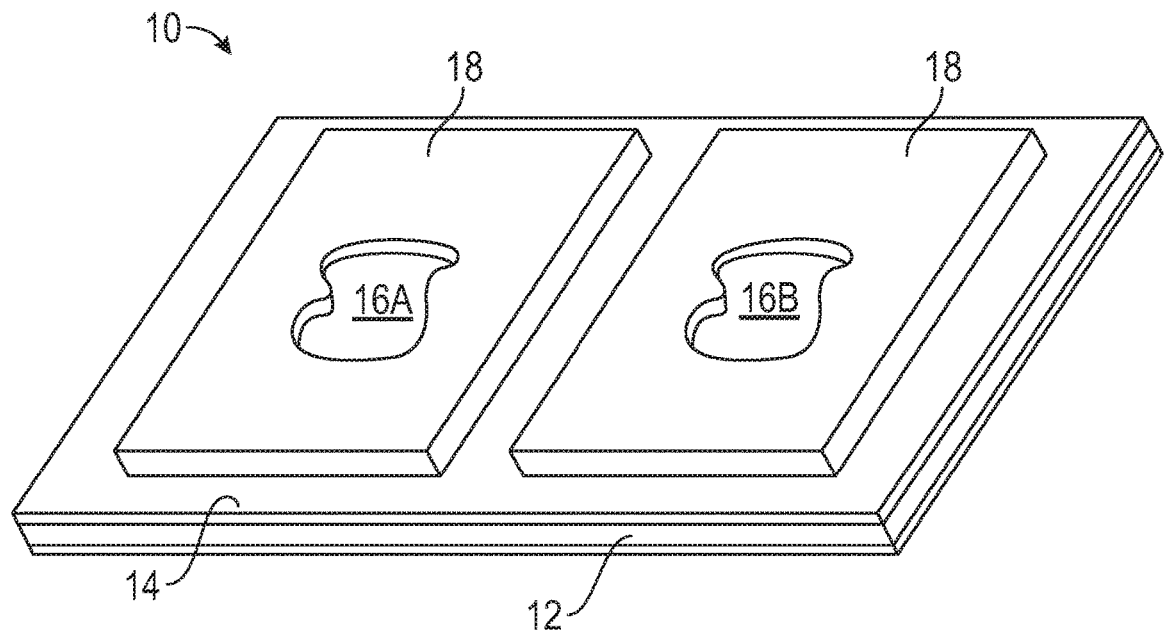
FIG. 2A illustrates a module having two sub-modules, which are covered by an overmold body according to embodiments disclosed herein.
Figure 2B:
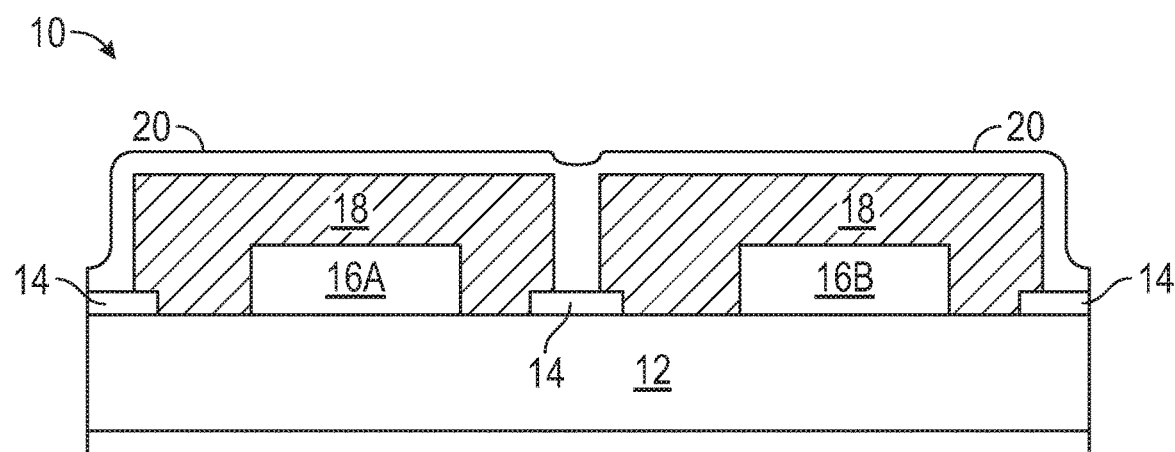
FIG. 2B illustrates a cross-section of the module of FIG. 2A in which an integrated electromagnetic shield is provided according to embodiments disclosed herein.

A given module 10 may include any number of component areas 16 where one or more of the component areas 16 have a corresponding electromagnetic shield 20. As illustrated in FIGS. 2A and 2B, two component areas 16A and 16B are positioned in the metallic layer grid 14 such that a peripheral metallic structure is provided for each of the component areas 16A and 16B. In certain instances, peripheral metallic structures for adjacent component areas 16A and 16B may share a common section of the metallic layer grid 14.

The illustrated module 10 has two component areas 16A and 16B, which lie within corresponding peripheral metallic structures and in which circuitry (not illustrated) for the module 10 is formed. Overmold bodies 18 reside over the substrate 12 and encompass the respective component areas 16A and 16B. As depicted in FIG. 2B, one or more electromagnetic shields 20 are integrally formed over the overmold bodies 18 and in contact with exposed portions of the respective peripheral metallic structures of the metallic layer grid 14. In particular, the one or more electromagnetic shields 20 encompass both component areas 16A and 16B and further extend between the component areas 16A and 16B. In the manner, EMI from outside sources and EMI between the component areas 16A and 16B may be reduced. Although the component areas 16A and 16B of the module 10 are illustrated as being adjacent one another, they may also be substantially separated from one another. In this manner, the module 10 is configured to include multiple sub-modules, each of which includes one of the component areas 16A or 16B as well as the corresponding overmold body 18 and the corresponding electromagnetic shield 20 or a portion of the electromagnetic shield 20.

Figure 3A:
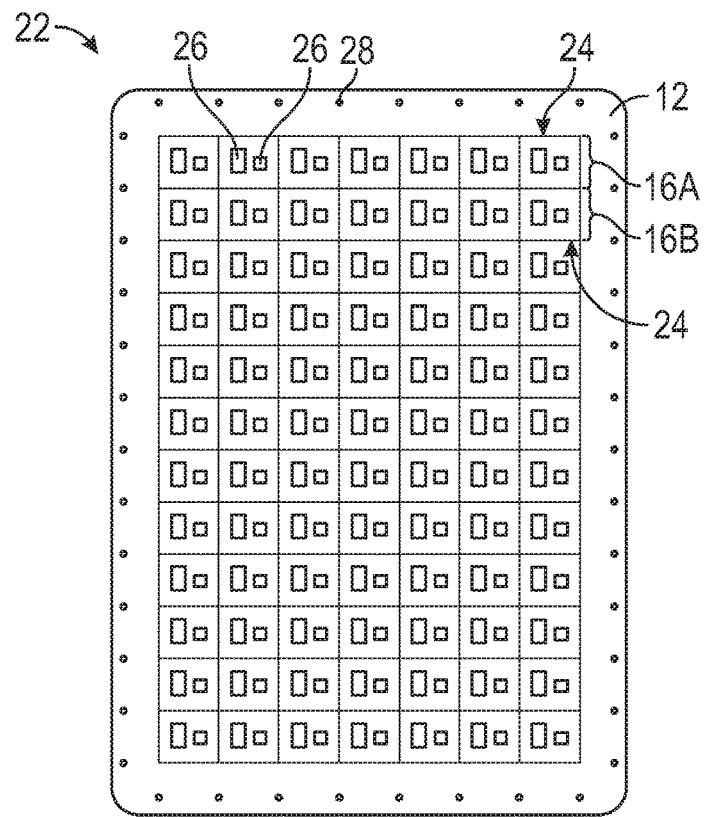
FIG. 3A is a top view of a meta-module at a certain state of fabrication according to embodiments disclosed herein.

FIG. 3A is a top view of a meta-module 22 at a certain state of fabrication according to embodiments disclosed herein. The meta-module 22 includes a plurality of components areas 16A and 16B mounted on a substrate 12 to form an array. Each of the component areas 16A and 16B are arranged to form a different area for a plurality of sub-modules 24. One or more electronic components 26 as previously described may be mounted or otherwise arranged within each of the component areas 16A and 16B. The substrate 12 may comprise a strip or an otherwise larger form of a laminate structure. A plurality of fiducials 28 are arranged along a perimeter of the substrate 12 and outside of the plurality of sub-modules 24. Fiducials 28, or recognition marks, have many uses in the electronics industry, including the indication of mounting locations for various electronic components or to indicate the locations of separation lines for electronic components or electronic modules during fabrication. In FIG. 3A, the fiducials 28 are arranged to indicate the location of boundaries of each sub-module 24. In other embodiments, groups of sub-modules 24 may form modules and the fiducials 28 may be arranged to indicate dicing lines for singulation of the modules.

Figure 3B:
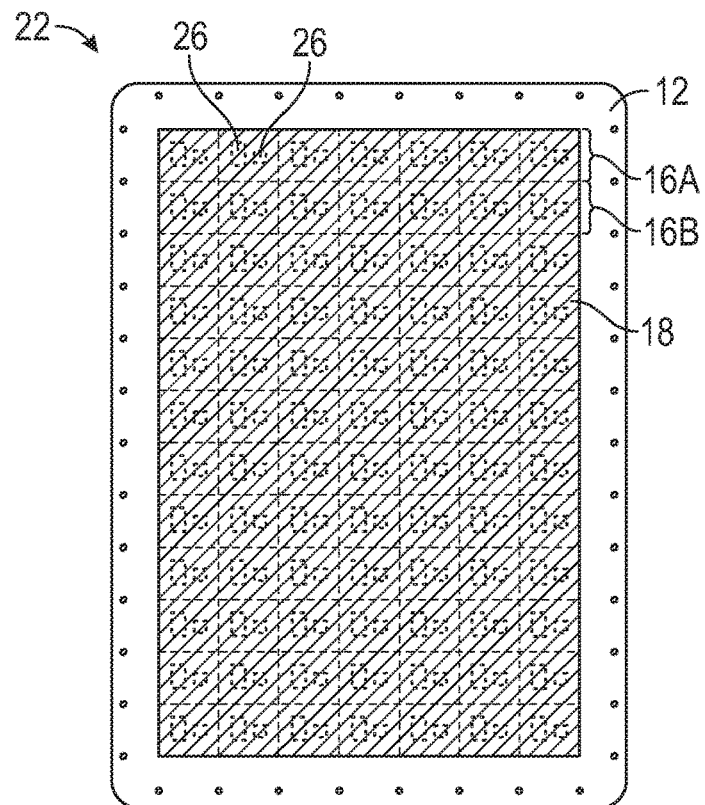
FIG. 3B is a top view of the meta-module of FIG. 3A at a subsequent state of fabrication after an overmold material has been applied to component areas of the meta-module.

FIG. 3B is a top view of the meta-module 22 of FIG. 3A at a subsequent state of fabrication after an overmold material 18 has been applied to the component areas 16A and 16B. As illustrated, the overmold material 18 may be blanket deposited or otherwise formed over the substrate 12 to cover each of the component areas 16A and 16B. The overmold material 18 may comprise one or more insulating or dielectric materials. In this regard, the overmold material 18 may be configured to provide encapsulation and electrical isolation for the electronic components 26 that are mounted to the component areas 16A and 16B of the substrate 12.

Figure 3C:
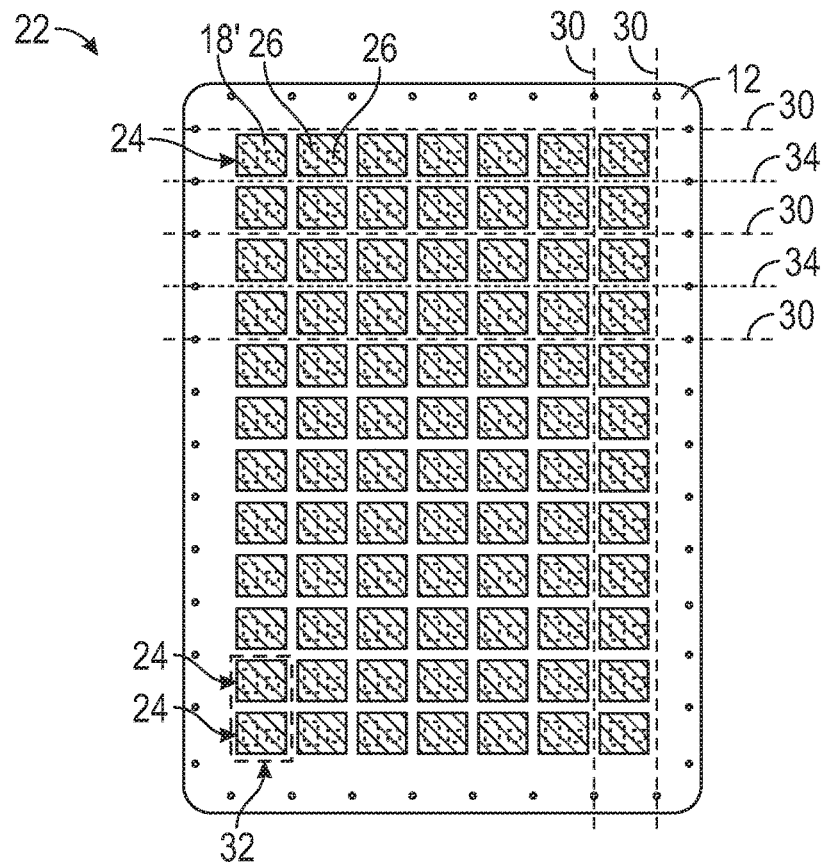
FIG. 3C is a top view of the meta-module of FIG. 3B at a subsequent state of fabrication where a plurality of overmold bodies are formed from the overmold material of FIG. 3B.

FIG. 3C is a top view of the meta-module 22 of FIG. 3B at a subsequent state of fabrication where a plurality of overmold bodies 18' are formed from the overmold material 18 of FIG. 3B. In FIG. 3C, a plurality of first separation lines 30 are illustrated that define locations where a plurality of modules 32 will later be divided or singulated from the meta-module 22. A plurality of second separation lines 34 are illustrated that define locations for the sub-modules 24 within each of the modules 32 after singulation. For simplicity, only a few of the first separation lines 30 and the second separation lines 34 are illustrated. It is understood that in practice, the first separation lines 30 and the second separation lines 34 may be arranged across all of the meta-module 22. The first separation lines 30 and the second separation lines 34 indicate lines where portions of the overmold material (18 of FIG. 3B) are subjected to a removal process. In certain embodiments, the removal process may include one or more of cutting, drilling, etching, or the like along each of the first separation lines 30 and the second separation lines 34. In certain embodiments, the removal process may be referred to as sub-dicing as individual modules 32 are not yet separated from the meta-module 22. Depending on the depth or amount of material to be removed, the removal process may be performed in one or more steps along the first separation lines 30 and the second separation lines 34. For example, if the removal process is intended remove the same amount of material along each of the first separation lines 30 and the second separation lines 34, then a sub-dicing process may be performed sequentially in rows and columns across the meta-module 22 that alternates between the first separation lines 30 and the second separation lines 34. In another example, if the removal process is intended to remove differing amounts of material along each of the first separation lines 30 and the second separation lines 34, then a first sub-dicing step may remove material along one of the first or second separation lines 30, 34, and a second sub-dicing step may remove material along the other of the first or second separation lines 30, 34. After the removal process is complete, each sub-module 24 includes one or more of the electronic components 26 and a separate overmold body 18' that is formed from the overmold material (18 of FIG. 3B). Additionally, openings that are formed along the first separation lines 30 and the second separation lines 34 may expose portions of the metallic layer grid (14 of FIG. 2B) that are electrically connected to ground. While two sub-modules 24 are illustrated for each module 32, the first separation lines 30 and the second separation lines 34 may be configured in different locations to provide different numbers of sub-modules 24 for each module 32 according to embodiments disclosed herein. In certain embodiments, exposed surfaces of the overmold bodies 18' may be cleaned, such as by a plasma cleaning process, to remove wax or other organic compounds and materials that remain on the surface of each overmold body 18'. The plasma cleaning process subjects the surface of each overmold body 18' to a reactive process gas, such as argon (Ar), oxygen (O), nitrogen (N), hydrogen (H), carbon tetrafluoride ($CF_4$), sulfur hexafluoride ($SF_6$), nitrogen tri-fluoride ($NF_3$), or the like, which effectively etches away contaminants on the exposed surface of each overmold body 18'. In essence, the contaminants are vaporized, burned, or otherwise removed from the exposed surface of each overmold body 18' when exposed to the process gas. In certain embodiments, the cleaned surface of each overmold body 18' for each sub-module 24 may be roughened through an abrasion process, a desmear technique, or like process. In one embodiment, a chemical roughening process is provided. It should be appreciated that a mask (not shown) may be positioned on the underside of the substrate 12 so that the processes described in the steps below do not interfere with any electrical contacts (not shown) that may be present on the bottom side of each sub-module 24. The mask helps prevent liquids and gases from reaching these electrical contacts, which may act as input/output contacts for the modules 32. Alternatively, a seal structure may be employed.

Figure 3D:
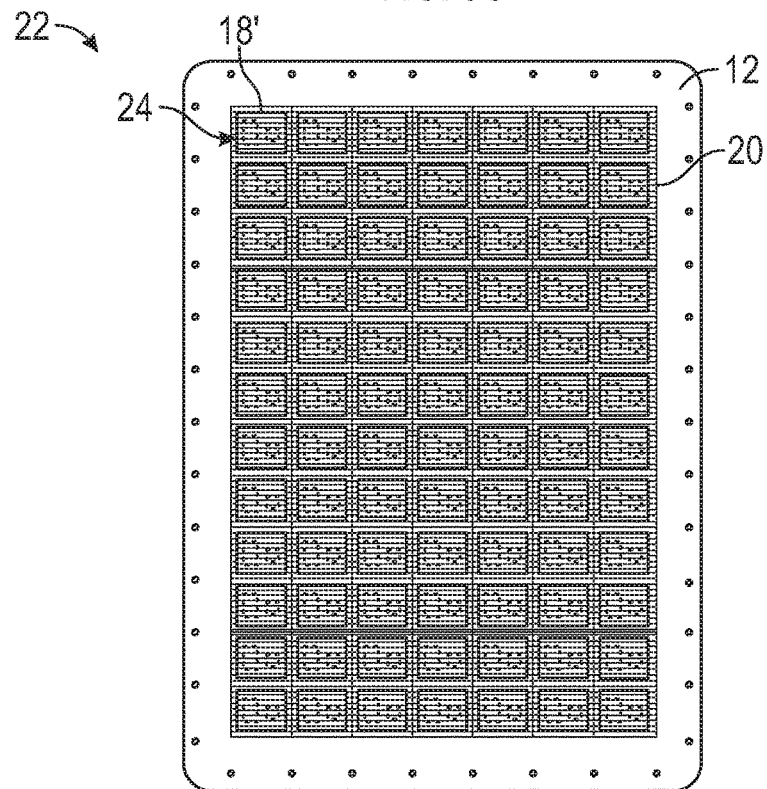
FIG. 3D is a top view of the meta-module of FIG. 3C at a subsequent state of fabrication after an electromagnetic shield has been blanket deposited over sub-modules of the meta-module.

FIG. 3D is a top view of the meta-module 22 of FIG. 3C at a subsequent state of fabrication after the electromagnetic shield 20 has been blanket deposited over the sub-modules 24. In certain embodiments, the electromagnetic shield 20 is deposited to conformally coat the plurality of sub-modules 24. In particular, the electromagnetic shield 20 may be configured to be conformal on top surfaces and sidewalls of each overmold body 18' of each sub-module 24 as well as on portions of the substrate 12 that are between the sub-modules 24. In certain embodiments, the electromagnetic shield 20 may be deposited as one or more layers of metal that are electrically grounded by way of exposed portions of the metallic layer grid (14 of FIG. 2B) between each of the overmold bodies 18'. The electromagnetic shield 20 may comprise a single layer or a plurality of layers. In certain embodiments, the electromagnetic shield 20 may comprise a first layer comprising a seed layer followed by one or more additional layers. For example, the seed layer may comprise a conductive material such as copper (Cu), aluminum (Al), silver (Ag), gold (Au), or combinations thereof deposited by electroless plating or the like. A second layer may be subsequently formed on the seed layer comprising a metal such as Cu, Al, Ag, Au, or combinations thereof deposited by electrolytic plating or the like, followed by a third layer formed on the second layer, wherein the third layer comprises a less conductive material, such as nickel (Ni) or other metals, than the seed layer or the first layer. The third layer may also be formed by electrolytic plating. The third layer may be provided to protect the seed layer and the first layer from tarnishing, corrosion, or other environmental effects. Likewise, the third layer may contribute to shielding by absorbing some electromagnetic radiation. In an exemplary embodiment, the electromagnetic shield 20 may be formed with an approximate thickness in a range from about 10 microns ($\mu$m) to about 50 $\mu$m. Greater or lesser thicknesses may also be generated. For example, in certain embodiments, the thickness of the electromagnetic shield 20 may be reduced to a range from about 5 $\mu$m to about 10 $\mu$m. In certain embodiments, the electromagnetic shield 20 may be referred to as a microshield.

Figure 3E:
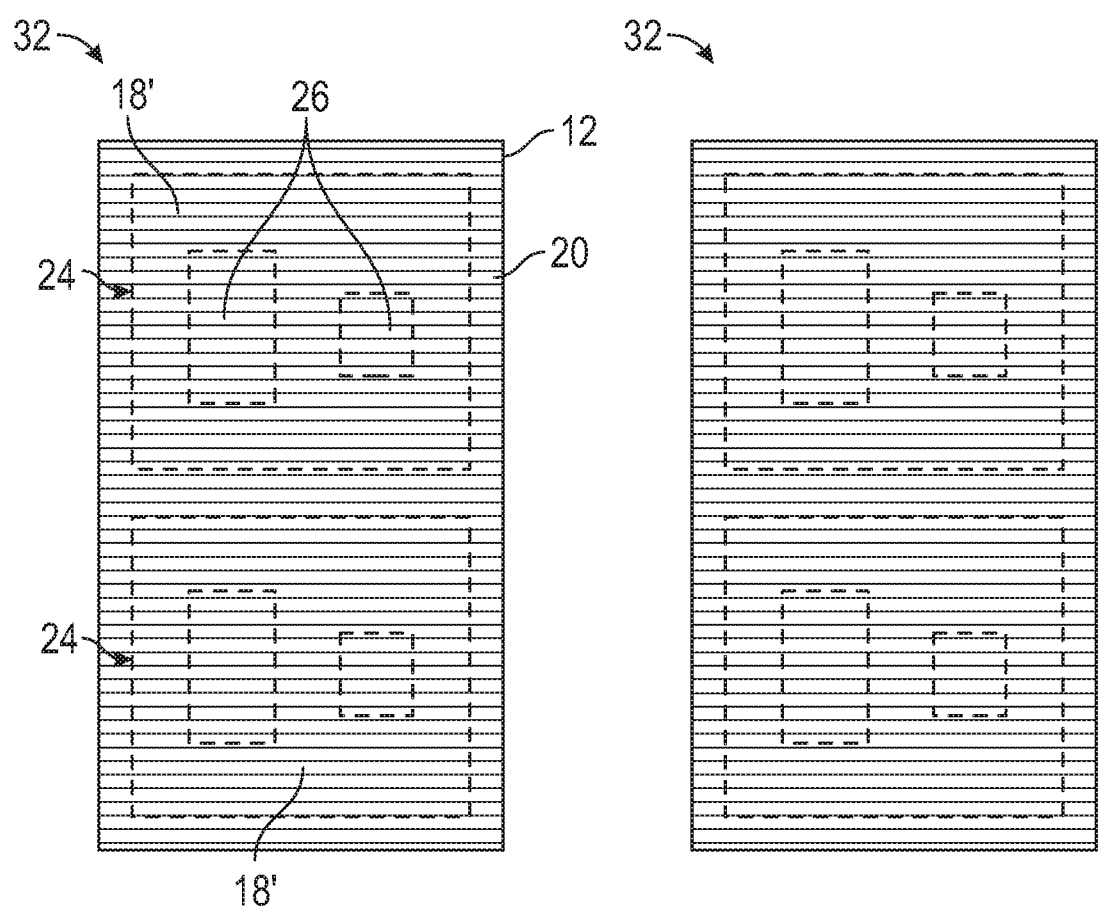
FIG. 3E is a top view of two modules that have been singulated from the meta-module of FIG. 3D.

FIG. 3E is a top view of two modules 32 that have been singulated from the meta-module 22 of FIG. 3D. In certain embodiments, singulation includes dicing, sawing, or otherwise separating the substrate (12 of FIG. 3C) along the plurality of first separation lines (30 of FIG. 3C). In this manner, each module 32 may comprise a plurality of the sub-modules 24, and each sub-module 24 may include one or more of the electronic components 26 and an overmold body 18'. Each module 32 further includes an electromagnetic shield 20 that is arranged to cover each sub-module 24 as well as portions of the substrate 12 that are uncovered by each sub-module 24. In this manner, each sub-module 24 is shielded from the other sub-module 24 as well as from external sources.

Figure 4:
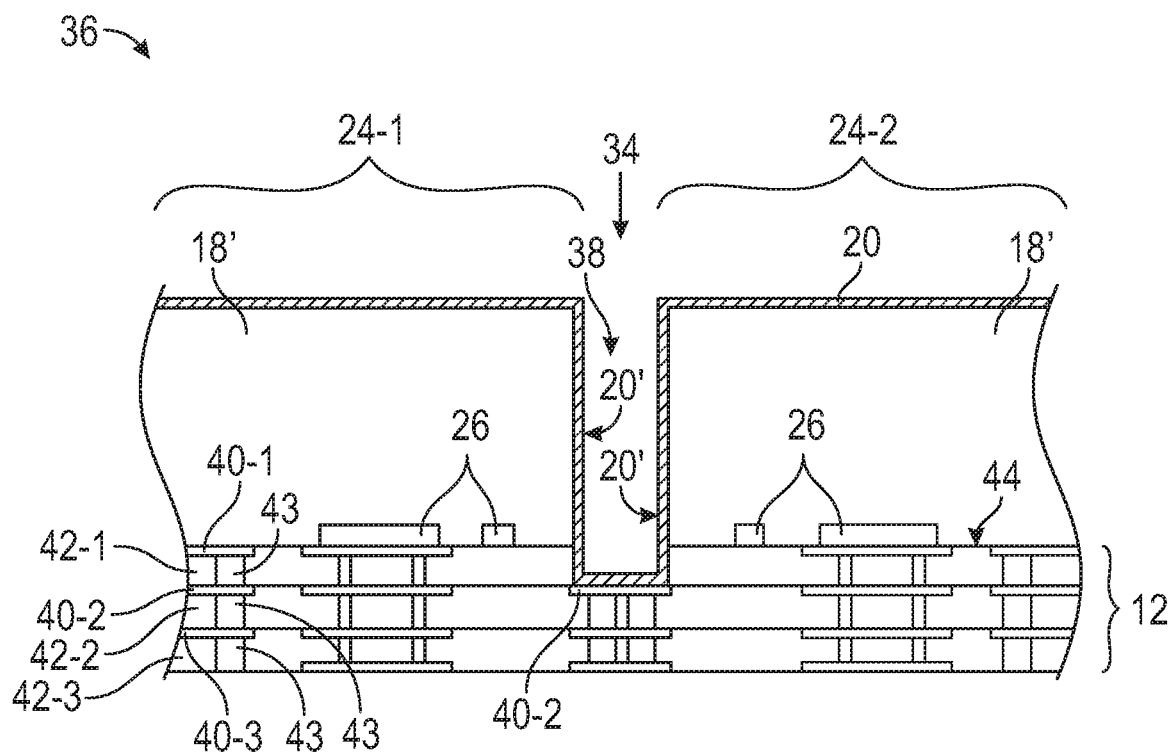
FIG. 4 is a cross-sectional view of a representative module according to embodiments disclosed herein.

FIG. 4 is a cross-sectional view of a representative module 36 according to embodiments disclosed herein. As illustrated, the module 36 includes a first sub-module 24-1 and a second sub-module 24-2, although other numbers of sub-modules are possible without deviating from the present disclosure. As previously described, the first and second sub-modules 24-1, 24-2 may each comprise one or more electronic components 26 mounted on the substrate 12 that are within a corresponding overmold body 18'. The module 36 further includes the electromagnetic shield 20 that is conformal over each of the sub-modules 24-1, 24-2. In particular, the electromagnetic shield 20 conformally covers the overmold bodies 18' of each sub-module 24-1, 24-2 as well as an opening 38 that is formed between the sub-modules 24-1, 24-2 during the removal process of the overmold material (18 of FIG. 3B) performed along the second separation line 34. As previously described, the substrate 12 may comprise a laminate structure that includes one or more metal layers 40-1 to 40-3 and one or more dielectric layers 42-1 to 42-3. One or more vias 43 may also be provided to provide electrical connections between different ones of the metal layers 40-1 to 40-3. In this regard, the substrate 12 may comprise a printed circuit board where the one or more metal layers 40-1 to 40-3 are laminated in an alternating configuration with the one or more dielectric layers 42-1 to 42-3. While three metal layers 40-1 to 40-3 are illustrated, the substrate 12 may be configured with any number of metal layers. Generally, increasing the number of laminated metal layers corresponds to an increased number of electronic components that may be mounted and electrically connected on a particular laminate structure. This allows electrical connections to various electronic components 26 to be made at different horizontal planes within the substrate 12. In certain embodiments, the one or more metal layers 40-1 to 40-3 may include Cu, copper foil, or the like while the one or more dielectric layers 42-1 to 42-3 may include fiber materials, glass, epoxy, glass-reinforced epoxy, ceramic materials, polymer materials and combinations thereof. Each of the metal layers 40-1 to 40-3 may comprise a pattern of continuous portions and discontinuous portions along the substrate 12. As illustrated, certain ones of the electronic components 26 are mounted to different portions of the first metal layer 40-1 on a mounting surface 44 of the substrate 12. In certain embodiments, one or more of the electronic components 26 may be flip-chip mounted on the mounting surface 44. Notably, the opening 38 is configured to extend into the substrate 12 through the first metal layer 40-1 and the first dielectric layer 42-1. In this regard, the electromagnetic shield 20 is arranged on the first sub-module 24-1 and the second sub-module 24-2, and a portion of the electromagnetic shield 20 is configured to extend between the first sub-module 24-1 and the second sub-module 24-2 to form one or more divider walls 20' that extend below the mounting surface 44. In particular, two divider walls 20' may be formed in the opening 38 where each of the divider walls 20' is conformal with one of the overmold bodies 18'. By having a portion of the electromagnetic shield 20 extend below the mounting surface 44 where the electronic components 26 are mounted, the electronic components 26 may be further surrounded by the electromagnetic shield 20 to provide further reduction in EMI. In FIG. 4, the electromagnetic shield 20 is configured to extend through the first metal layer 40-1 and the first dielectric layer 42-1 to contact and electrically connect with a portion of the second metal layer 40-2 that is electrically connected to ground. As previously described, the opening 38 between the sub-modules 24-1, 24-2 is formed by a removal process along the second separation line 34. In certain embodiments, a width of the opening 38 measured as a distance from the first sub-module 24-1 to the second sub-module 24-2 may include a range from about 0.1 millimeters (mm) to about 3 mm, depending on the application and the removal process used to fabricate the opening 38. For example, sawing with a saw blade of a particular width may provide an opening 38 with a width that is at least equal to the width of the saw blade.

Figure 5:
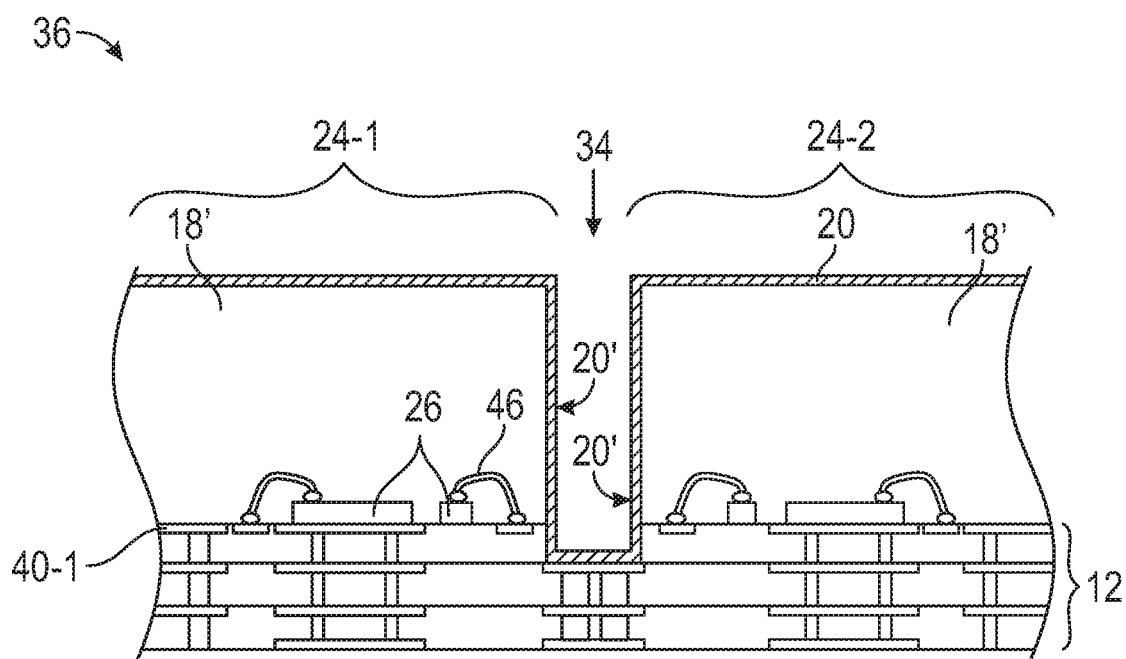
FIG. 5 is a cross-sectional view of an alternative configuration of the module of FIG. 4 where one or more of the electronic components comprise wirebond connections.

FIG. 5 is a cross-sectional view of an alternative configuration of the module 36 of FIG. 4 where one or more of the electronic components 26 comprise wirebond connections 46. The module 36 includes the first sub-module 24-1 and the second sub-module 24-2 on the substrate 12, as well as the electromagnetic shield 20 as previously described. The wirebond connections 46 are configured to extend between corresponding ones of the electronic components 26 and corresponding portions of the first metal layer 40-1. As illustrated, the wirebond connections 46 at least partially extend into the overmold bodies 18'. In this regard, the wirebond connections 46 are formed prior to the overmold bodies 18' such that the overmold bodies 18' provide electrical insulation and mechanical support for the wirebond connections 46. For cellphone handsets, wirebond connections 46 are often used in applications with higher power requirements. The wirebond connections 46 may provide electrical connection, thermal connection, or both between the electronic components 26 and the substrate 12. In certain applications, the wirebond connections 46 can act as miniature antennas that facilitate undesirable leakage or interference of signals from the first sub-module 24-1 to the second sub-module 24-2. As illustrated, the electromagnetic shield 20 including the divider walls 20' are arranged to reduce or prevent such crosstalk or EMI between the sub-modules 24-1, 24-2 with the wirebond connections 46. In certain embodiments, wirebond connections 46 and flip-chip mounting of different ones of the electronic components 26 may be provided in the same sub-module 24-1, 24-2 or module 36.

Figure 6:
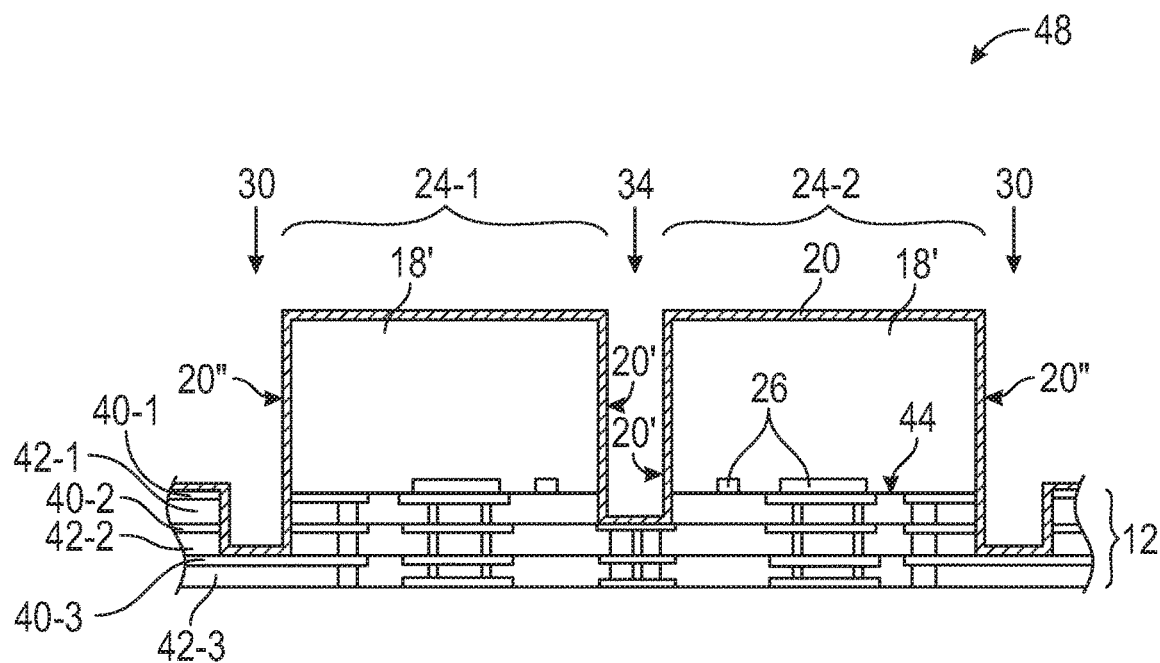
FIG. 6 is a cross-sectional view of a module where a perimeter sidewall of an electromagnetic shield is configured to extend into a substrate according to embodiments disclosed herein.

FIG. 6 is a cross-sectional view of a module 48 where a perimeter sidewall 20" of the electromagnetic shield 20 is configured to extend into the substrate 12 according to embodiments disclosed herein. The module 48 includes the first sub-module 24-1 and the second sub-module 24-2 on the substrate 12, as well as the electromagnetic shield 20 as previously described. The overmold body 18' for each sub-module 24-1, 24-2 is formed by the plurality of first separation lines 30 that define perimeter borders of the module 48 and the plurality of second separation lines 34 that define each of the sub-modules 24-1, 24-2. A portion of the electromagnetic shield 20 is configured to extend between the first sub-module 24-1 and the second sub-module 24-2 to form the one or more divider walls 20' that extend below the mounting surface 44 as previously described. In certain embodiments, the electromagnetic shield 20 forms one or more perimeter sidewalls 20" that surround the sub-modules 24-1, 24-2 along a perimeter of the module 48. Notably, at least one perimeter sidewall 20" is configured to extend into a perimeter portion of the substrate 12. As previously described, the substrate 12 may comprise a laminate structure that includes the one or more metal layers 40-1 to 40-3 and the one or more dielectric layers 42-1 to 42-3. In certain embodiments, at least one perimeter sidewall 20" of the electromagnetic shield 20 is configured to extend below the mounting surface 44 where the one or more electronic components 26 are mounted to the substrate 12. As illustrated in FIG. 6, at least one of the perimeter sidewalls 20" is configured to extend through the first metal layer 40-1, the first dielectric layer 42-1, the second metal layer 40-2, and the second dielectric layer 42-2 to contact a portion of the third metal layer 40-3 that is electrically connected to ground. In this manner, the perimeter sidewalls 20" are grounded such that electromagnetic emissions that strike the perimeter sidewalls 20" are electrically shorted to ground. By having one or more of the perimeter sidewalls 20" extend below the mounting surface 44, the electronic components 26 may be further surrounded by the electromagnetic shield 20 to provide further reduction in EMI. In certain embodiments, one or more of the perimeter sidewalls 20" and one or more of the divider walls 20' are configured to extend below the mounting surface 44. One or more of the perimeter sidewalls 20" and one or more of the divider walls 20' may be configured to extend to different horizontal planes within the substrate 12 depending on the application. In FIG. 6, the divider walls 20' are configured to extend to a horizontal plane defined by the second metal layer 40-2 while the perimeter sidewalls 20" are configured to extend to a different horizontal plane that is defined by the third metal layer 40-3. In other embodiments, the different horizontal planes may be defined by different metal layers of the substrate 12 without deviating from the present disclosure.

Figure 7:
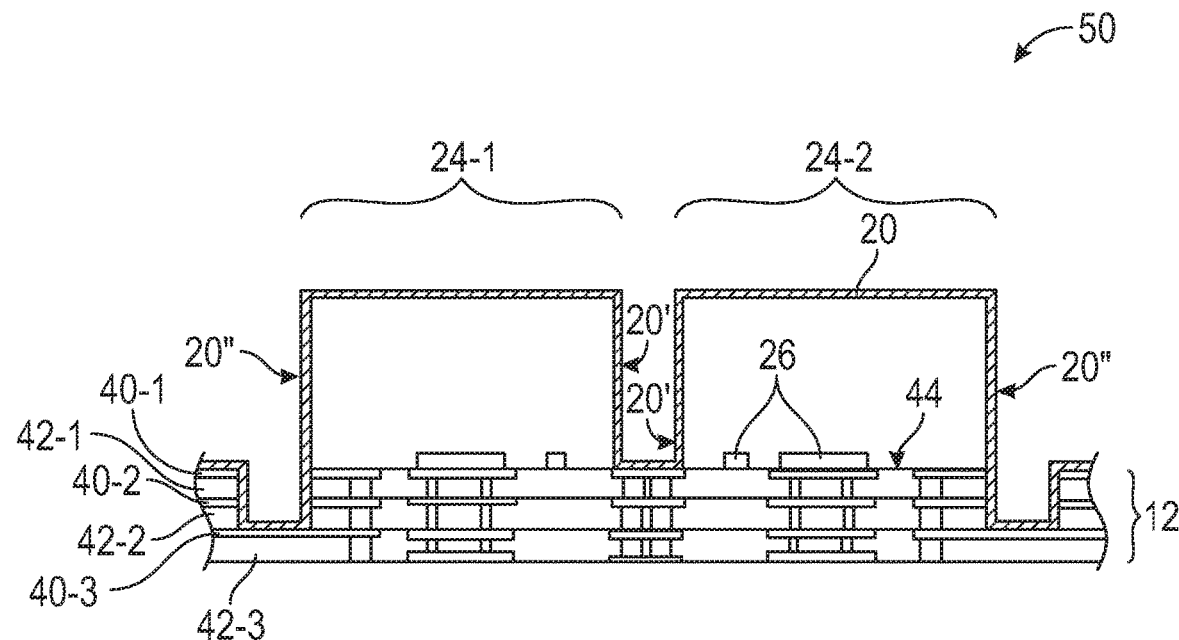
FIG. 7 is a cross-sectional view of a module where one or more perimeter sidewalls of an electromagnetic shield extend below a mounting surface of a substrate and one or more divider walls of the electromagnetic shield extend to the mounting surface according to embodiments disclosed herein.

FIG. 7 is a cross-sectional view of a module 50 where one or more perimeter sidewalls 20" of the electromagnetic shield 20 extend below the mounting surface 44 of the substrate 12, and one or more divider walls 20' of the electromagnetic shield 20 extend to the mounting surface 44. The module 50 includes the first sub-module 24-1 and the second sub-module 24-2 on the substrate 12, as well as the electromagnetic shield 20 as previously described. Each of the sub-modules 24-1, 24-2 may include one or more of the electronic components 26 that are mounted to the mounting surface 44 of the substrate 12. The substrate 12 may comprise a laminate structure that includes the one or more metal layers 40-1 to 40-3 and the one or more dielectric layers 42-1 to 42-3 as previously described. In a similar manner to FIG. 6, one or more of the perimeter sidewalls 20" and one or more of the divider walls 20' of FIG. 7 are configured to extend to different horizontal planes of the substrate 12. In particular, the perimeter sidewalls 20" are configured to extend through the first metal layer 40-1, the first dielectric layer 42-1, the second metal layer 40-2, and the second dielectric layer 42-2 to contact a portion of the third metal layer 40-3 that is electrically connected to ground. The divider walls 20' are configured to extend between the sub-modules 24-1, 24-2 to a portion of the first metal layer 40-1 that is at the mounting surface 44 of the substrate 12. A portion of the first metal layer 40-1 in contact with the divider walls 20' may also be electrically connected to ground. In this manner, the divider walls 20' may not be configured to extend into the substrate 12 for certain applications.

Figure 8:
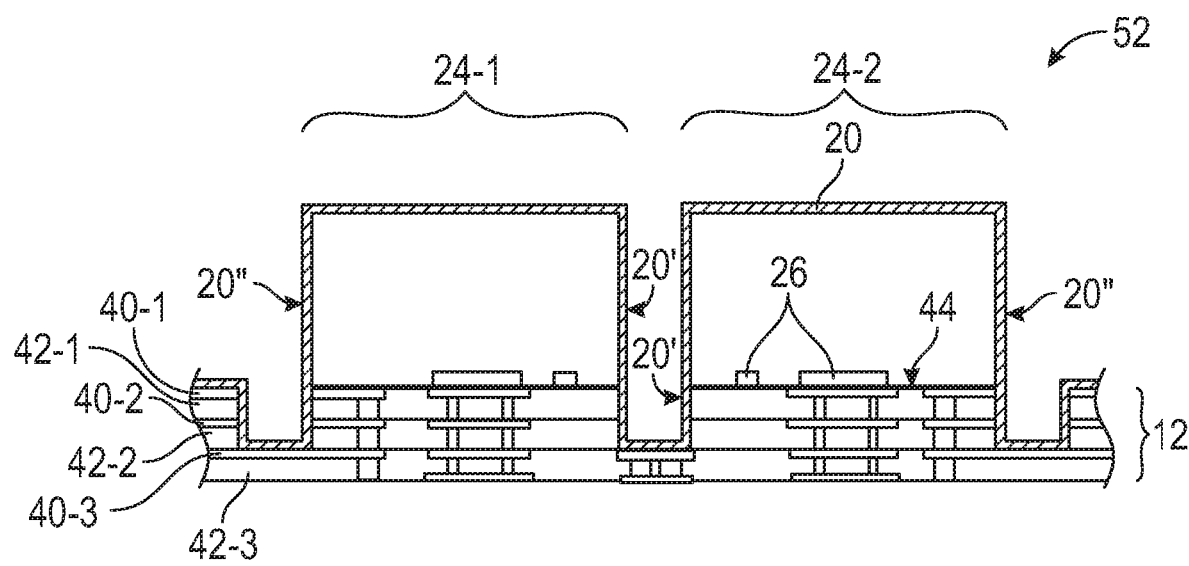
FIG. 8 is a cross-sectional view of a module where one or more perimeter sidewalls and one or more divider walls of an electromagnetic shield extend below a mounting surface of a substrate to a same horizontal plane within the substrate according to embodiments disclosed herein.

FIG. 8 is a cross-sectional view of a module 52 where one or more perimeter sidewalls 20" and one or more divider walls 20' of the electromagnetic shield 20 extend below the mounting surface 44 of the substrate 12 to the a same horizontal plane within the substrate 12. The module 52 includes the first sub-module 24-1 and the second sub-module 24-2 on the substrate 12, as well as the electromagnetic shield 20 as previously described. Each of the sub-modules 24-1, 24-2 may include one or more of the electronic components 26 that are mounted to the mounting surface 44 of the substrate 12. The substrate 12 may comprise a laminate structure that includes the one or more metal layers 40-1 to 40-3 and the one or more dielectric layers 42-1 to 42-3 as previously described. In FIG. 8, the perimeter sidewalls 20" and the divider walls 20' are configured to extend through the first metal layer 40-1, the first dielectric layer 42-1, the second metal layer 40-2, and the second dielectric layer 42-2 to contact portions of the third metal layer 40-3 that are electrically connected to ground. In this manner, the perimeter sidewalls 20" and the divider walls 20' may extend through the substrate 12 to a same horizontal plane that is within the substrate 12. In FIG. 8, the same horizontal plane is defined by the third metal layer 40-3. In other embodiments, the perimeter sidewalls 20" and the divider walls 20' may extend to a same horizontal plane that is defined by other metal layers (e.g., 40-2) of the substrate 12.

Figure 9:
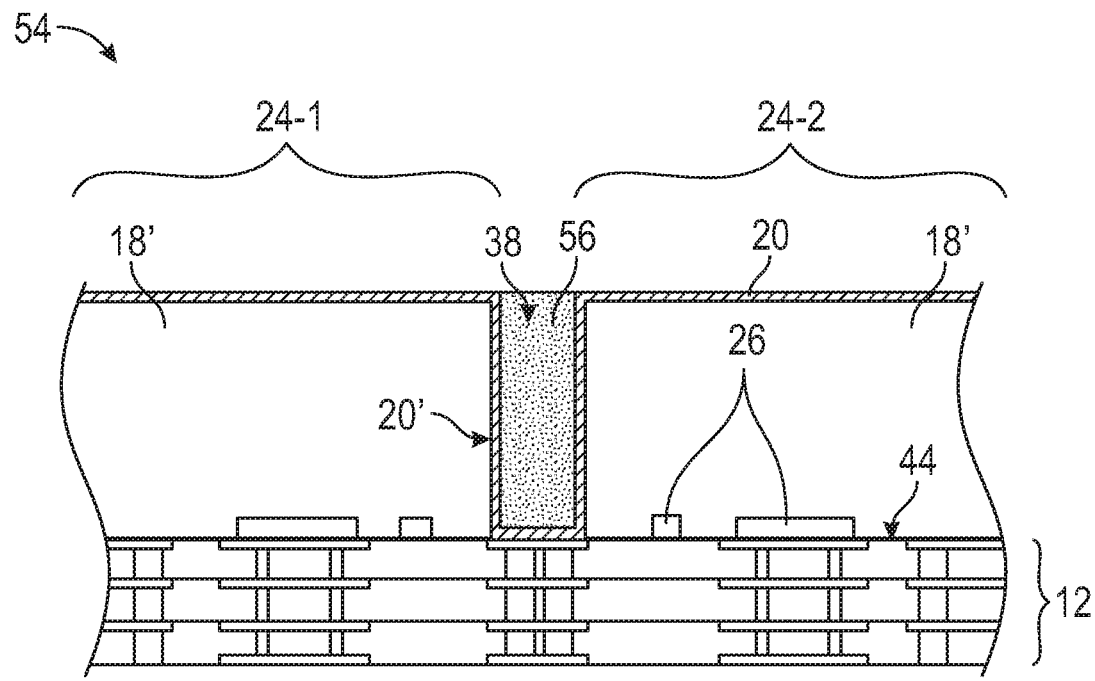
FIG. 9 is a cross-sectional view of a module where a fill material is applied in an opening that is formed between sub-modules of the module according to embodiments disclosed herein.

FIG. 9 is a cross-sectional view of a module 54 where a fill material 56 is applied in the opening 38 that is formed between the sub-modules 24-1, 24-2 according to embodiments disclosed herein. The module 54 includes the first sub-module 24-1 and the second sub-module 24-2 on the substrate 12, as well as the electromagnetic shield 20 as previously described. Each of the sub-modules 24-1, 24-2 may include one or more of the electronic components 26 that are mounted on the mounting surface 44 of the substrate 12. As previously described, the electromagnetic shield 20 is arranged to conformally coat the overmold body 18' of each sub-module 24-1, 24-2 as well as portions of the substrate 12 that are between and uncovered by the sub-modules 24-1, 24-2. In certain embodiments, the fill material 56 may be arranged in the opening 38 between each sub-module 24-1, 24-2 to provide structural support. In this manner, the fill material 56 may be arranged on the portion of the electromagnetic shield 20 that is in the opening 38 and along one or more portions of the divider walls 20' of the electromagnetic shield 20. In certain embodiments, the fill material 56 is configured to partially, but not fully fill the opening 38 and in other embodiments, the fill material 56 may completely fill the opening 38. The fill material 56 may comprise one or more of an epoxy, a mold compound, and a thermoset material, among others. In certain embodiments, the fill material 56 comprises one or more insulating or dielectric materials. In certain embodiments, the fill material 56 may comprise the same material as the overmold bodies 18' of each sub-module 24-1, 24-2. The fill material 56 may be formed by dispensing, molding, transfer molding, or compression molding techniques, among others. In other embodiments, the fill material 56 may comprise a conductive material, such as conductive epoxy, or one or more metallized layers (not shown) formed by various plating or deposition techniques. In embodiments where the divider walls 20' of the electromagnetic shield 20 extend below the mounting surface 44 of the substrate 12, the fill material 56 may also extend below the mounting surface 44.

Figure 10A:
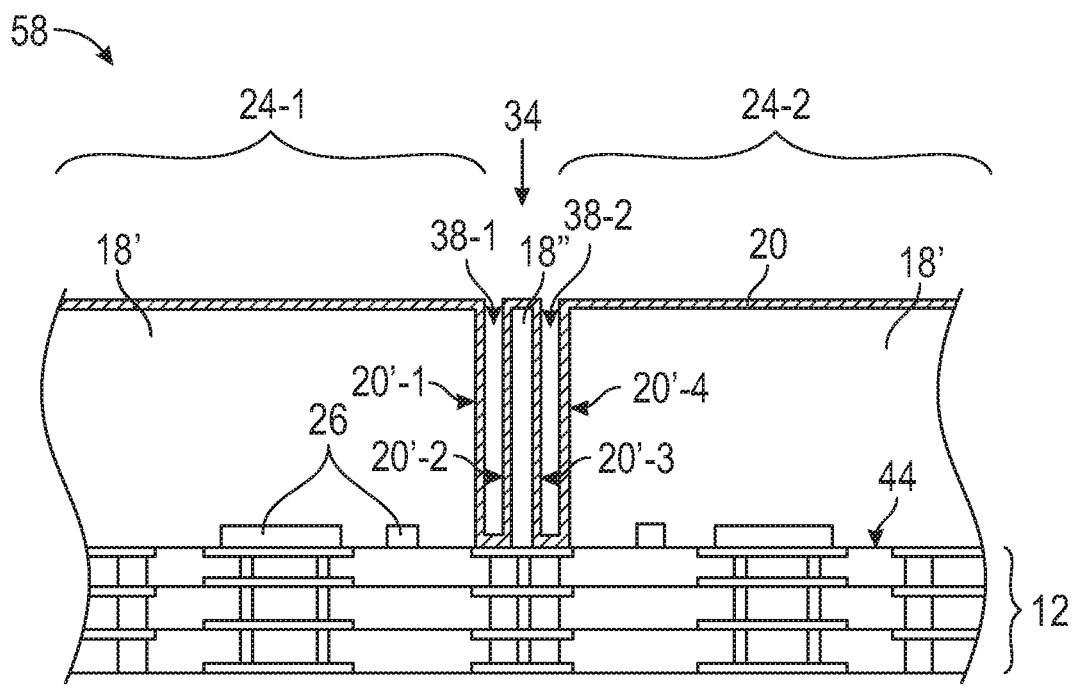
FIG. 10A is a cross-sectional view of a module where a plurality of openings and a plurality of divider walls of an electromagnetic shield are configured between sub-modules of the module according to embodiments disclosed herein.

FIG. 10A is a cross-sectional view of a module 58 where a plurality of openings 38-1, 38-2, as well as a plurality of divider walls 20'-1 to 20'-4 of the electromagnetic shield 20 are configured between the sub-modules 24-1, 24-2 according to embodiments disclosed herein. The module 58 includes the first sub-module 24-1 and the second sub-module 24-2 on the substrate 12, as well as the electromagnetic shield 20 as previously described. Each of the sub-modules 24-1, 24-2 may include one or more of the electronic components 26 that are mounted on the mounting surface 44 of the substrate 12. In FIG. 10A, the plurality of openings 38-1, 38-2 are formed between the first sub-module 24-1 and the second sub-module 24-2. The plurality of openings 38-1, 38-2 may be formed by performing multiple removal processes that are adjacent to one another along the second separation line 34. For example, a fabrication technique may comprise passing a narrow blade saw to cut two adjacent portions of the overmold material (18 of FIG. 3B) along the second separation line 34 between each of the sub-modules 24-1, 24-2. In this manner, the plurality of openings 38-1, 38-2 are formed between the first and second sub-modules 24-1, 24-2. Additionally, another overmold body 18" may thereby be formed between the plurality of openings 38-1, 38-2 and between the sub-modules 24-1, 24-2. After the plurality of openings 38-1, 38-2 are formed, the electromagnetic shield 20 may be configured to conformally coat the overmold bodies 18' of each sub-module 24-1, 24-2 as well as the overmold body 18" that is arranged between the sub-modules 24-1, 24-2. In this manner, the electromagnetic shield 20 may form the plurality of divider walls 20'-1 to 20'-4 between the sub-modules 24-1, 24-2. Accordingly, further reduction of crosstalk or EMI between sub-modules 24-1, 24-2 may be provided. In certain embodiments, the plurality of divider walls 20'-1 to 20'-4 may extend into the substrate 12 and below the mounting surface 44 of the substrate 12 in any of the configurations previously described.

Figure 10B:
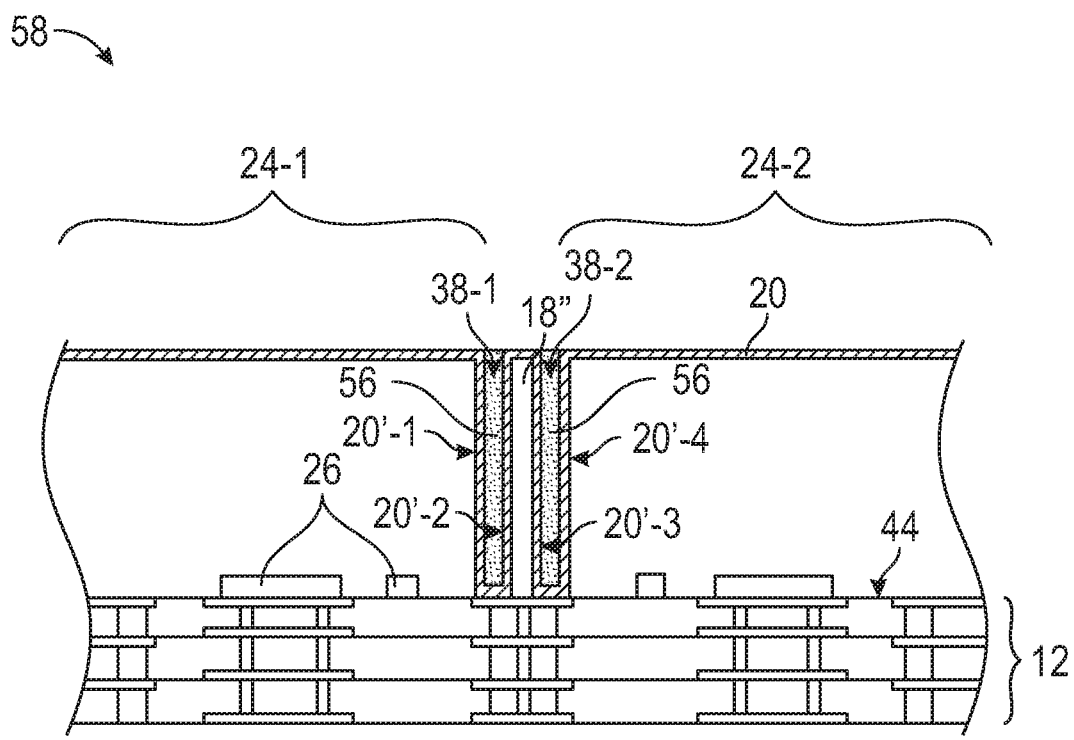
FIG. 10B is a cross-sectional view of the module of FIG. 10A where the plurality of openings are filled with the fill material of FIG. 9.

FIG. 10B is a cross-sectional view of the module 58 of FIG. 10A where the plurality of openings 38-1 to 38-2 are filled with the fill material 56 of FIG. 9. As illustrated, the fill material 56 may be applied to partially or completely fill the plurality of openings 38-1 to 38-2 between each of the sub-modules 24-1, 24-2 to provide structural support for the sub-modules 24-1, 24-2 as well as the overmold body 18" that is arranged between the sub-modules 24-1, 24-2. In this manner, the fill material 56 may be arranged to partially or completely extend along each of the plurality of divider walls 20'-1 to 20'-4 of the electromagnetic shield 20. For embodiments where the plurality of divider walls 20'-1 to 20'-4 extend into the substrate 12 and below the mounting surface 44 of the substrate 12, the fill material 56 in each of the openings 38-1, 38-2 may also extend below the mounting surface 44.

Those skilled in the art will recognize improvements and modifications to the preferred embodiments of the present disclosure. All such improvements and modifications are considered within the scope of the concepts disclosed herein and the claims that follow.

What is claimed is:

1. An electronic module comprising:
   a substrate;
   a first sub-module and a second sub-module arranged on a mounting surface of the substrate; and
   an electromagnetic shield arranged on the first sub-module and the second sub-module, wherein a portion of the electromagnetic shield is configured to extend between the first sub-module and the second sub-module to form a divider wall that extends below the mounting surface, and the electromagnetic shield forms a perimeter sidewall that extends to a different horizontal plane within the substrate than the divider wall.

2. The electronic module of claim 1, wherein the substrate comprises a plurality of metal layers and one or more dielectric layers.

3. The electronic module of claim 2, wherein the portion of the electromagnetic shield that is between the first sub-module and the second sub-module is configured to extend through at least a portion of a first dielectric layer of the one or more dielectric layers.

4. The electronic module of claim 1, wherein the first sub-module comprises one or more first electronic components within a first overmold body and the second sub-module comprises one or more second electronic components within a second overmold body.

5. The electronic module of claim 4, wherein the electromagnetic shield is configured to be conformal with the first overmold body and the second overmold body.

6. The electronic module of claim 4, wherein at least one of the one or more first electronic components comprises a wirebond connection that at least partially extends into the first overmold body.

7. The electronic module of claim 1, wherein the electromagnetic shield is conformal over the first sub-module, the second sub-module, and a portion of the mounting surface that is uncovered by the first sub-module and the second sub-module.

8. The electronic module of claim 1, wherein the perimeter sidewall is configured to extend into a perimeter portion of the substrate.

9. The electronic module of claim 8, wherein the electromagnetic shield forms a plurality of divider walls between the first sub-module and the second sub-module.

10. An electronic module comprising:
    a substrate;
    a first sub-module and a second sub-module arranged on a mounting surface of the substrate with an opening formed therebetween;
    an electromagnetic shield arranged on the first sub-module and the second sub-module, wherein a portion of the electromagnetic shield is configured to extend into the opening and along a portion of the substrate that is between the first sub-module and the second sub-module to form a divider wall, and the electromagnetic shield forms a perimeter sidewall that extends below the mounting surface, wherein the perimeter sidewall extends to a different horizontal plane within the substrate than the divider wall; and
    a fill material that is arranged on the portion of the electromagnetic shield that is in the opening.

11. The electronic module of claim 10, wherein the fill material is configured to partially fill the opening.

12. The electronic module of claim 10, wherein the fill material is configured to completely fill the opening.

13. The electronic module of claim 10, wherein the fill material comprises a conductive material.

14. The electronic module of claim 10, wherein the first sub-module comprises one or more first electronic components within a first overmold body and the second sub-module comprises one or more second electronic components within a second overmold body.

15. The electronic module of claim 14, wherein the fill material comprises a same material as the first overmold body and the second overmold body.

16. The electronic module of claim 10, wherein a plurality of openings are formed between the first sub-module and the second sub-module.

17. The electronic module of claim 16, wherein the fill material at least partially fills the plurality of openings.

18. The electronic module of claim 10, wherein the fill material is configured to extend below the mounting surface of the substrate.

* * * * *